(12) United States Patent
Ogihara et al.

(10) Patent No.: US 9,005,883 B2
(45) Date of Patent: Apr. 14, 2015

(54) PATTERNING PROCESS

(71) Applicant: Shin-Etsu Chemical Co., Ltd., Tokyo (JP)

(72) Inventors: Tsutomu Ogihara, Jyoetsu (JP); Takafumi Ueda, Jyoetsu (JP)

(73) Assignee: Shin-Estu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/952,316

(22) Filed: Jul. 26, 2013

(65) Prior Publication Data

US 2014/0093825 A1    Apr. 3, 2014

(30) Foreign Application Priority Data

Oct. 1, 2012    (JP) ................................ 2012-219408

(51) Int. Cl.
*G03F 7/26* (2006.01)
*G03F 7/00* (2006.01)

(52) U.S. Cl.
CPC .................... *G03F 7/0035* (2013.01)

(58) Field of Classification Search
CPC ................... B81C 2201/0198; B81C 1/00476; B81C 2201/0132; B81C 2201/0133; C08L 83/04; G03F 7/0392; G03F 7/0035; G03F 7/40; G03F 7/004; G03F 7/20; G03F 7/405; G03F 7/0758; G03F 7/168; G03F 7/38; H01L 2924/10253; H01L 21/0337; H01L 21/3086; H01L 21/0273; H01L 21/31144; H01L 21/0274; H01L 21/02282; H01L 21/3122; H01L 21/32139
USPC .................. 430/313, 314, 323, 324, 325, 330
See application file for complete search history.

(56) References Cited

U.S. PATENT DOCUMENTS

2006/0019195 A1    1/2006 Hatakeyama et al.
2008/0064213 A1*   3/2008 Jung ............................ 438/696
(Continued)

FOREIGN PATENT DOCUMENTS

JP    A-2004-153125    5/2004
JP    A-2005-128509    5/2005
(Continued)

OTHER PUBLICATIONS

Maenhoudt et al., "Double Patterning scheme for sub-0.25 kl single damascene structures at NA=0.75, λ=193nm," *Proceedings of SPIE*, 2005, vol. 5754, pp. 1508-1518.
(Continued)

*Primary Examiner* — Caleen Sullivan
(74) *Attorney, Agent, or Firm* — Oliff PLC

(57) ABSTRACT

The invention provides a patterning process comprises the steps of: (1) forming a positive chemically amplifying type photoresist film on a substrate to be processed followed by photo-exposure and development thereof by using an organic solvent to obtain a negatively developed pattern, (2) forming a silicon-containing film by applying a silicon-containing film composition comprising a solvent and a silicon-containing compound capable of becoming insoluble in a solvent by a heat, an acid, or both, (3) insolubilizing in a solvent the silicon-containing film in the vicinity of surface of the negatively developed pattern, (4) removing the non-insolubilized part of the silicon-containing film to obtain an insolubilized part as a silicon-containing film pattern, (5) etching the upper part of the silicon-containing film pattern thereby exposing the negatively developed pattern, (6) removing the negatively developed pattern, and (7) transferring the silicon-containing film pattern to the substrate to be processed.

11 Claims, 2 Drawing Sheets

(56) References Cited

U.S. PATENT DOCUMENTS

| | | | |
|---|---|---|---|
| 2008/0118860 A1 | 5/2008 | Harada et al. | |
| 2008/0122125 A1* | 5/2008 | Zhou | 257/797 |
| 2008/0187860 A1* | 8/2008 | Tsubaki et al. | 430/270.1 |
| 2009/0136869 A1 | 5/2009 | Ogihara et al. | |
| 2010/0003622 A1 | 1/2010 | Matsumaru et al. | |
| 2010/0178617 A1* | 7/2010 | Hatakeyama et al. | 430/323 |
| 2011/0117746 A1* | 5/2011 | Maruyama et al. | 438/703 |

FOREIGN PATENT DOCUMENTS

| | | |
|---|---|---|
| JP | A-2007-199653 | 8/2007 |
| JP | A-2008-33174 | 2/2008 |
| JP | A-2008-111103 | 5/2008 |
| JP | A-2009-126940 | 6/2009 |

OTHER PUBLICATIONS

Fritze et al., "Nanofabrication with deep-ultraviolet lithography and resolution enhancements," *J. Vac. Sci. Technol.*, 1999, vol. 17, No. 6, pp. 3310-3313.

Kono et al., "Implementation of immersion lithography to NAND/CMOS device manufacturing," *Toshiba Corporation*, 2007, pp. 1-24.

* cited by examiner

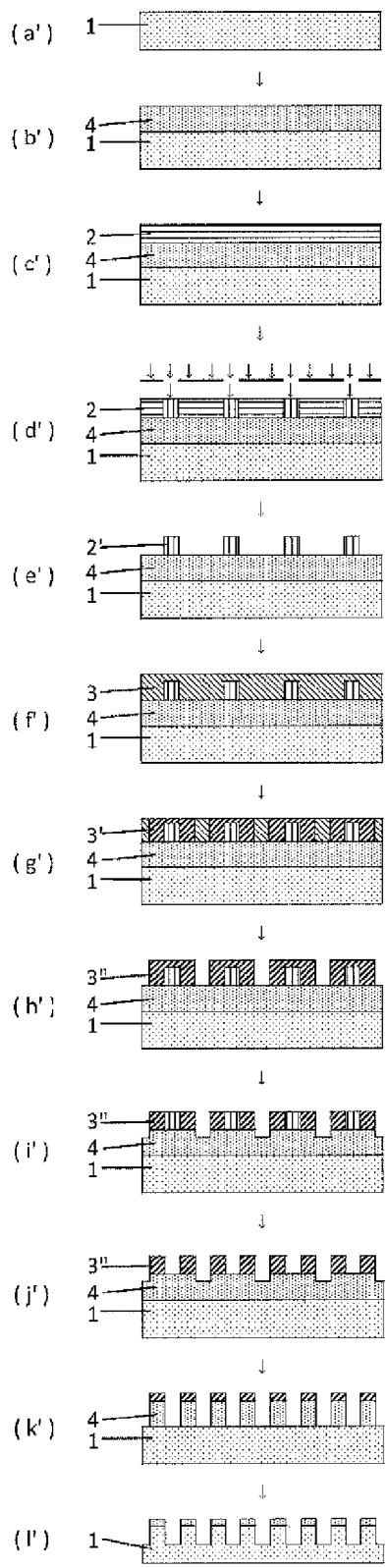

PATTERNING PROCESS

BACKGROUND OF THE INVENTION

1. Field of the Invention

The present invention relates to a patterning process by a sidewall spacer method.

2. Description of the Related Art

In 1980s, photo-exposure using a g-beam (436 nm) or an i-beam (365 nm) of a mercury lamp as a light source had been widely used in the resist patterning. As a means for further miniaturization, shifting to a shorter wavelength of the exposure light was assumed to be effective, so that, in mass production process after the DRAM (Dynamic Random Access Memory) with 64 megabits (processing dimension of 0.25 µm or less) in 1990s, a KrF excimer laser (248 nm), a shorter wavelength than the i-beam (365 nm), had been used in place of the i-beam as the exposure light source.

However, in production of the DRAM with integration of 256 MB and 1 GB or higher which require further miniaturized process technologies (processing dimension of 0.2 µm or less), a light source with further short wavelength is required, and thus, a photolithography using an ArF excimer laser (193 nm) has been investigated seriously since about a decade ago. At first, the ArF lithography was planned to be applied to manufacturing of a device starting from a 180-nm node device, but the life of the KrF excimer lithography was prolonged to mass production of the 130-nm node device; and thus, a full-fledged application of the ArF lithography started from the 90-nm node. Further, mass production of the 65-nm node device is now underway by combining it with a lens having an increased NA till 0.9. Further shortening of wavelength of the exposure light is progressing in the next 45-nm node device; and for that, the $F_2$-lithography with 157 nm wavelength became a candidate for it. However, there are many problems in the $F_2$ lithography: cost-up of a scanner due to use of the large quantities of the expensive $CaF_2$ single crystal for a projection lens; extremely poor sustainability of a soft pellicle, which leads to change of an optical system due to introduction of a hard pellicle; decrease in etching resistance of a resist film, and so forth. Because of these problems, development of the $F_2$ lithography was suspended, and the ArF immersion lithography was introduced.

In the ArF immersion lithography, water having refractive index of 1.44 is introduced between a projection lens and a wafer by a partial fill method thereby enabling high speed scanning; and thus, mass production of the 45-nm node device is now underway by using a lens with a NA class of 1.3.

For the 32-nm node lithography technology, lithography with a vacuum ultraviolet beam (EUV) of 13.5 nm wavelength is considered to be a candidate. Problems to be solved in the EUV lithography are to obtain a higher output power of the laser, a higher sensitivity of the resist film, a higher resolution, a lower line edge roughness (LER), a non-defect MoSi laminate mask, a lower aberration of the reflective mirror, and so forth; and thus, there are mounting problems to be solved. Development of the immersion lithography with a high refractive index, another candidate for the 32-nm node, was suspended, because transmittance of LUAG, a candidate for a high refractive index lens, is low, and refractive index of the liquid could not reach an aimed value of 1.8. Accordingly, in the photo-exposure used as a general technology, resolution based on the wavelength of a light source is approaching to its inherent limit.

In recent years, a double patterning process, in which a pattern is formed by a first photo-exposure and development, and then a pattern is formed exactly in the space of the first patterns by a second photo-exposure, is drawing an attention as one miniaturization technology (Non-Patent Document 1). Many processes are proposed as to the double patterning process. For example, there is a method in which a photo resist pattern with a line-and-space interval of 1:3 is formed by a first photo-exposure and development, an underlying hard mask is processed by a dry etching, an another hard mask is formed on it, in a space formed by the first photo-exposure is formed a line pattern by photo-exposure and development of the photo mask layer, and then the hard mask is dry-etched to form a line-and-space pattern having a half width of the first pattern pitch. There is also another method in which a photo resist pattern with a line-and-space interval of 1:3 is formed by a first photo-exposure and development, an underlying hard mask is processed by dry etching, a photo resist layer is coated on it, photo-exposure of the second space pattern is made on a remaining part of the hard mask, and then the hard mask is processed by dry etching. In any of these methods, the hard mask is processed by two dry-etching processes.

In the former method, the hard mask needs to be formed twice. In the latter method, only one layer of the hard mask is needed, but a trench pattern, in which resolution is more difficult as compared with a line pattern, needs to be formed. In the latter method, a negative resist material may be used for the formation of the trench pattern. With this method, a high-contrast light similar to that used to form a line by a positive development pattern may be used. However, a negative resist material has a lower dissolution contrast as compared with a positive resist material, and thus, the negative resist material gives a lower resolution as compared with the case in which the line is formed by the positive resist material when the negative resist material is used to form the same dimension of the trench pattern. In the latter method, it may be conceivable to apply a thermal flow method in which a wide trench pattern is formed by using a positive resist material, and then the trench pattern is shrunk by heating a substrate, and a RELACS method in which a water-soluble layer is coated on a trench pattern after development, and then the trench is shrunk by a thermal crosslink of a resist layer surface. In these methods, however, there are problems of deterioration of a proximity bias and a low throughput due to the further complicated process.

In both of the former and the latter methods, two etchings are necessary in the substrate processing, thereby causing problems of a lower throughput as well as a deformation and misalignment of the pattern due to the two etchings.

To perform the etching only once, there is a method in which a negative resist material is used in the first photo-exposure and a positive resist material is used in the second photo-exposure. There is another method in which a positive resist material is used in the first photo-exposure and a negative resist material dissolved in a higher alcohol which has 4 or more carbon atoms and does not dissolve the positive resist material is used in the second photo-exposure. In these methods, the resolution is deteriorated due to the use of a negative resist material having a low resolution.

Other method in which a pattern formed by the first photo-exposure and development is treated with a reactive metal compound to insolubilize the pattern, and then the second pattern is newly formed between the first patterns by photo-exposure and development is proposed (Patent Document 1).

The most critical problem in the double patterning process like this is the overlay accuracy of the first and the second patterns. A magnitude of the position displacement leads to variation of the line dimension; and thus, for example, to form the 32-nm line with 10% accuracy, the overlay accuracy within 3.2 nm is necessary. Because the overlay accuracy of the present scanner is about 8 nm, a substantial improvement in accuracy is necessary.

Because of the problem of the overlay accuracy of a scanner and the difficulty to divide one pattern into two, a method in which a pitch is halved in a single photo-exposure is investigated. For example, a method in which a pitch is halved by forming films on both sides of a line pattern sidewall is proposed (Non-Patent Document 2). For this sidewall spacer method, a spacer space method, in which a hard mask of the resist underlayer and a film embedded into a space between films attached on its sidewall are used as an etching pattern, and a spacer line method, in which a film attached on a hard mask sidewall of the resist underlayer is used as an etching pattern, are proposed (Non-Patent Document 3).

Further, a sidewall spacer method in which a sidewall of $SiO_2$, α-Si, α-C, or the like is formed to a core pattern by a CVD method, and then the core pattern is removed by dry etching thereby forming the sidewall pattern so that the pattern pitch is halved is proposed. However, in this method, heating temperature of 150° C. or higher is necessary to form the sidewall. Accordingly, if the resist pattern formed by photo-exposure was used as the core, the pattern was collapsed at this temperature; and thus, strength of the core was insufficient for the spacer. Because of this, a complicated process in which this resist pattern is transferred to the core material of $SiO_2$ or α-C by dry etching and then the sidewall is formed to this has been used.

As mentioned above, as the pattern rule is progressing toward further miniaturization in recent years, a patterning process with which a further finer pattern can be formed conveniently and efficiently is wanted.

PRIOR ART DOCUMENTS

Patent Documents

Patent Document 1: Japanese Patent Laid-Open Publication No. 2008-33174

Non-Patent Documents

Non-Patent Document 1: Proc. SPIE, Vol. 5754, p. 1508 (2005)
Non-Patent Document 2: J. Vac. Sci. Technol., B17 (6), November/December, 1999
Non-Patent Document 3: Fourth Symposium on Liquid Immersion (2007), Presentation No.: PR-01, Title: Implementation of immersion lithography to NAND/CMOS lithography to NAND/CMOS device manufacturing

SUMMARY OF THE INVENTION

The present invention was made in view of the situation mentioned above, and has an object to provide a highly practical patterning process that can form a further finer pattern conveniently and efficiently and can be used in a semiconductor manufacturing process.

To solve the problems mentioned above, the present invention provides a patterning process comprising the steps of:
(1) forming a photoresist film on a substrate to be processed by using a positive chemically amplifying type photoresist film composition which contains an acid generator, followed by subjecting the photoresist film to photo-exposure and then to development by using an organic solvent, thereby forming a negatively developed pattern,
(2) forming a silicon-containing film on the substrate to be processed having thereon the negatively developed pattern by applying a silicon-containing film composition comprising a silicon-containing compound capable of becoming insoluble in a solvent by a heat, an acid, or both and a solvent not dissolving the negatively developed pattern,
(3) insolubilizing in a solvent the silicon-containing film in the vicinity of surface of the negatively developed pattern by heating, an acid contained in the negatively developed pattern as a catalyst, or both,
(4) removing the non-insolubilized part of the silicon-containing film by dissolving it with an organic solvent thereby obtaining an insolubilized part as a silicon-containing film pattern;
(5) dry-etching or wet-etching the upper part of the silicon-containing film pattern thereby exposing the upper part of the negatively developed pattern,
(6) removing the negatively developed pattern by dry etching or wet etching, and
(7) transferring the pattern to the substrate to be processed by using, as an etching mask, the silicon-containing film pattern whose upper part is dry-etched or wet-etched.

In the negatively developed pattern obtained from the positive chemically amplifying type photoresist film, there exists a large amount of an acid derived and generated from the acid generator by photo-exposure. By action of this acid, the silicon-containing compound contained in the silicon-containing film reacts in the vicinity of surface of the negatively developed pattern thereby forming the solvent-insolubilized silicon-containing film. Then, an extra silicon-containing film not insolubilized is removed by an organic solvent to leave only the insolubilized coat film in the vicinity of the negatively developed pattern surface remained so that the sidewall can be formed. This insolubilized silicon-containing film and the negatively developed pattern are different in their etching selectivities so that the negatively developed pattern can be removed by dry-etching or wet-etching without damaging the silicon-containing film pattern. Then, the pattern having the pattern pitch thereof halved can be transferred to the substrate by using the obtained silicon-containing pattern as an etching mask.

Accordingly, the present invention can provide a highly practical patterning process that can form a further finer pattern conveniently and efficiently and can be used in a semiconductor manufacturing process.

In addition, the present invention provides a patterning process comprising the steps of:
(1) forming an organic underlayer film on a substrate to be processed, forming a photoresist film on the organic underlayer film by using a positive chemically amplifying type photoresist film composition which contains an acid generator, and then subjecting the photoresist film to photo-exposure and then to development by using an organic solvent, thereby forming a negatively developed pattern,
(2) forming a silicon-containing film on the substrate to be processed having thereon the negatively developed pattern by applying a silicon-containing film composition comprising a silicon-containing compound capable of becoming insoluble in a solvent by a heat, an acid, or both and a solvent not dissolving the negatively developed pattern,
(3) insolubilizing in a solvent the silicon-containing film in the vicinity of surface of the negatively developed pattern by heating, an acid contained in the negatively developed pattern as a catalyst, or both, (4) removing the non-insolubilized part of the silicon-containing film by dissolving it with an organic solvent thereby obtaining an insolubilized part as a silicon-containing film pattern, (5) dry-etching or wet-etching the upper part of the silicon-containing film pattern thereby exposing the upper part of the negatively developed pattern, (6) removing the negatively developed pattern by dry etching or wet etching, (7) transferring the pattern to the organic underlayer film by using, as an etching mask, the silicon-containing film pattern whose upper part is dry-etched or wet-etched, and (8) transferring the organic underlayer film pattern to the substrate to be processed.

Accordingly, the patterning process of the present invention can be applied to the case that an organic underlayer film is formed on the substrate to be processed.

Here, as the silicon-containing compound, it is preferable to use a silicon-containing compound having a substituent group capable of generating a phenolic hydroxyl group, a naphthol hydroxyl group, or both by a heat, an acid, or both, or a silicon-containing compound having an epoxy skeleton, an oxetane skeleton, or both.

By using the silicon-containing compound as mentioned above, the reactivity between the silicon-containing compound and an acid that is derived and generated from the acid generator in the negatively developed pattern during photo-exposure is improved so that the silicon-containing film can be readily insolubilized in a solvent in the vicinity of surface of the negatively developed pattern.

It is preferable to use a silicon-containing film composition containing a crosslinking agent as the silicon containing film composition.

When the silicon-containing film composition is made to contain a crosslinking agent therein, a crosslinking reaction takes place by the acid that is derived and generated from the acid generator in the negatively developed pattern; and as a result, the silicon-containing film can be made more insoluble in a solvent.

Also, it is preferable to use a silicon-containing film composition containing a heat-sensitive acid generator as the silicon-containing film composition.

When the silicon-containing film composition is made to contain a heat-sensitive acid generator, the crosslinking reaction can be further facilitated.

It is preferable that the organic underlayer film be formed by a spin coating method.

When coating of the organic underlayer film is made by a spin coating method, the organic underlayer film having a uniform thickness can be formed conveniently.

According to the present invention, an organic solvent not dissolving the negatively developed pattern can be chosen in the silicon-containing film composition so that the silicon-containing film can fill the space between the negatively developed patterns without damaging the negatively developed pattern during the time of applying the silicon-containing film composition. Furthermore, the solvent-insolubilized silicon-containing film and the negatively developed pattern are different in their etching selectivities so that the negatively developed pattern can be removed without damaging the silicon-containing film pattern by choosing the condition of dry-etching or wet-etching.

Accordingly, the present invention can provide a highly practical patterning process that can form a further finer pattern conveniently and efficiently and can be used in a semiconductor manufacturing process.

BRIEF DESCRIPTION OF THE DRAWINGS

FIG. 2 is an explanatory drawing of another example of the patterning process according to the present invention.

DESCRIPTION OF THE PREFERRED EMBODIMENTS

Figure 1:
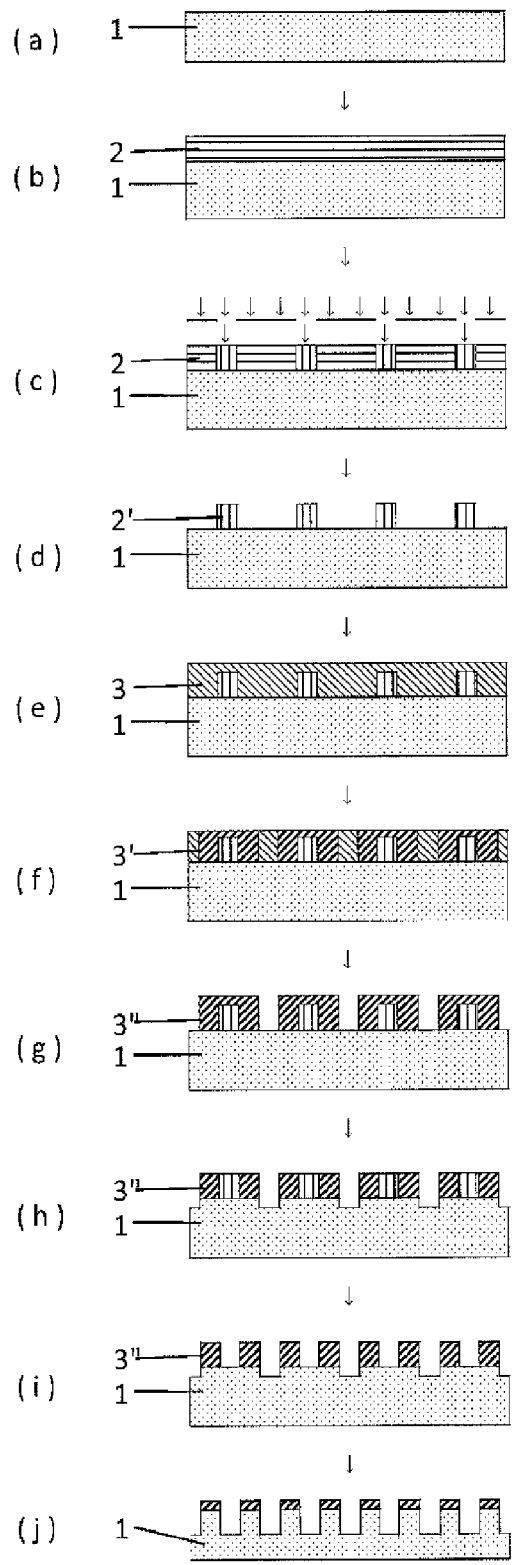
FIG. 1 is an explanatory drawing of one example of the patterning process according to the present invention.

Hereinafter, the present invention will be explained more specifically.

As mentioned above, as the pattern rule progresses toward further miniaturization in recent years, a highly practical patterning process that can form a further finer pattern conveniently and efficiently and can be used in a semiconductor manufacturing process has been considered necessary.

Inventors of the present invention carried out an extensive investigation to accomplish the foregoing object; and as a result, they found that a fine pattern can be formed on a substrate conveniently and efficiently by using a patterning process comprising the steps of:

(1) forming a photoresist film on a substrate to be processed by using a positive chemically amplifying type photoresist film composition which contains an acid generator, followed by subjecting the photoresist film to photo-exposure and then to development by using an organic solvent, thereby forming a negatively developed pattern, (2) forming a silicon-containing film on the substrate to be processed having thereon the negatively developed pattern by applying a silicon-containing film composition comprising a silicon-containing compound capable of becoming insoluble in a solvent by a heat, an acid, or both and a solvent not dissolving the negatively developed pattern, (3) insolubilizing in a solvent the silicon-containing film in the vicinity of surface of the negatively developed pattern by heating, an acid contained in the negatively developed pattern as a catalyst, or both, (4) removing the non-insolubilized part of the silicon-containing film by dissolving it with an organic solvent thereby obtaining an insolubilized part as a silicon-containing film pattern, (5) dry-etching or wet-etching the upper part of the silicon-containing film pattern thereby exposing the upper part of the negatively developed pattern, (6) removing the negatively developed pattern by dry etching or wet etching, and (7) transferring the pattern to the substrate to be processed by using, as an etching mask, the silicon-containing film pattern whose upper part is dry-etched or wet-etched.

One embodiment of the present invention will be explained by referring to the drawings; but the present invention is not limited to these.

FIG. 1 is an explanatory drawing to show one example of the patterning process according to the present invention.

Firstly, in the step (1), the photoresist film 2 is formed on the substrate to be processed 1 by using a positive chemically amplifying type photoresist film composition which contains an acid generator (FIGS. 1(a) and 1(b)); and then, the photoresist film 2 is photo-exposed (FIG. 1(c)) and developed by using an organic solvent to obtain the negatively developed pattern 2' (FIG. 1(d)). Then, in the step (2), a silicon-containing film composition comprising a silicon-containing compound which is insolubilized in a solvent by a heat, an acid, or both and a solvent not dissolving the negatively developed pattern is applied on the substrate to be processed 1 having thereon the negatively developed pattern 2' to form the silicon-containing film 3 (FIG. 1(e)). In the step (3), the silicon-containing film 3 is insolubilized in a solvent in the vicinity of surface of the negatively developed pattern 2' by heating, an acid contained in the negatively developed pattern 2' as a catalyst, or both to obtain the insolubilized silicon-containing film 3' (FIG. 1(f)). Then, in the step (4), the non-insolubilized part of the silicon-containing film is removed by dissolving it with an organic solvent to obtain the insolubilized part as the silicon-containing film pattern 3" (FIG. 1(g)). In the step (5), the upper part of the silicon-containing film pattern 3" is dry-etched or wet-etched thereby forming the sidewall and exposing the upper part of the negatively developed pattern 2' (FIG. 1(h)). Further, in the step (6), the negatively developed pattern 2' is removed by dry-etching or wet-etching (FIG. 1(i)). In the step (7), the pattern can be transferred to the substrate to be processed 1 by using, as an etching mask, the silicon-containing film pattern 3" whose upper part is dry-etched or wet-etched (FIG. 1(j)).

In addition, inventors of the present invention found that a convenient, efficient, and further practical patterning process can be provided, if the process comprises the steps of:
(1) forming an organic underlayer film on a substrate to be processed, forming a photoresist film on the organic underlayer film by using a positive chemically amplifying type photoresist film composition which contains an acid generator, and then subjecting the photoresist film to photo-exposure and then to development by using an organic solvent, thereby forming a negatively developed pattern,
(2) forming a silicon-containing film on the substrate to be processed having thereon the negatively developed pattern by applying a silicon-containing film composition comprising a silicon-containing compound capable of becoming insoluble in a solvent by a heat, an acid, or both and a solvent not dissolving the negatively developed pattern,
(3) insolubilizing in a solvent the silicon-containing film in the vicinity of surface of the negatively developed pattern by heating, an acid contained in the negatively developed pattern as a catalyst, or both,
(4) removing the non-insolubilized part of the silicon-containing film by dissolving it with an organic solvent thereby obtaining an insolubilized part as a silicon-containing film pattern,
(5) dry-etching or wet-etching the upper part of the silicon-containing film pattern thereby exposing the upper part of the negatively developed pattern,
(6) removing the negatively developed pattern by dry etching or wet etching,
(7) transferring the pattern to the organic underlayer film by using, as an etching mask, the silicon-containing film pattern whose upper part is dry-etched or wet-etched, and
(8) transferring the organic underlayer film pattern to the substrate to be processed.

FIG. 2 is an explanatory drawing to show another example of the patterning process according to the present invention.

Firstly, in the step (1), the organic underlayer film 4 is formed on the substrate to be processed 1 (FIG. 2(a') and 2(b')), the photoresist film 2 is formed on the organic underlayer film 4 by using a positive chemically amplifying type photoresist film composition which contains an acid generator (FIG. 2(c')); and then, the photoresist film 2 is photo-exposed (FIG. 2(d')) and developed by using an organic solvent to obtain the negatively developed pattern 2' (FIG. 2(e')). Then, in the step (2), a silicon-containing film composition comprising a silicon-containing compound which is insolubilized in a solvent by a heat, an acid, or both and a solvent not dissolving the negatively developed pattern is applied on the substrate to be processed 1 having thereon the negatively developed pattern 2' to form the silicon-containing film 3 (FIG. 2(f)). In the step (3), the silicon-containing film 3 is insolubilized in a solvent in the vicinity of surface of the negatively developed pattern 2' by heating, an acid contained in the negatively developed pattern 2' as a catalyst, or both to obtain the insolubilized silicon-containing film 3' (FIG. 2(g')). Then, in the step (4), the non-insolubilized part of the silicon-containing film is removed by dissolving it with an organic solvent to obtain the insolubilized part as the silicon-containing film pattern 3" (FIG. 2(h')). In the step (5), the upper part of the silicon-containing film pattern 3" is dry-etched or wet-etched thereby forming the sidewall and exposing the upper part of the negatively developed pattern 2' (FIG. 2(i')). Further, in the step (6), the negatively developed pattern 2' is removed by dry-etching or wet-etching (FIG. 1(j')). In the step (7), the pattern is transferred to the organic underlayer film 4 by using, as an etching mask, the silicon-containing film pattern 3" whose upper part is dry-etched or wet-etched (FIG. 2(k')). And in the step (8), the pattern can be transferred to the substrate to be processed 1 by using the pattern of the organic underlayer film 4 as an etching mask (FIG. 2(l')).

Hereinafter, each step will be explained in order in more detail.

In the step (1), the photoresist film 2 is formed on the substrate to be processed 1 by using a positive chemically amplifying type photoresist film composition which contains an acid generator; and then, the photoresist film 2 is photo-exposed and developed by using an organic solvent to obtain the negatively developed pattern 2'.

As to the substrate to be processed 1, a semiconductor substrate coated with, as the layer to be processed (the part to be processed), any of a metal film, a metal carbide film, a metal oxide film, a metal nitride film, and a metal oxynitride film may be used.

As to the semiconductor substrate, although a silicon substrate is generally used, it is not particularly restricted; and thus, a material that is different from the layer to be processed, such as Si, amorphous silicon (α-Si), p-Si, $SiO_2$, SiN, SiON, W, TiN, and Al may be used.

The metal that constitutes the layer to be processed may be any of silicon, titanium, tungsten, hafnium, zirconium, chromium, germanium, copper, aluminum, and iron, or a metal alloy of them. Illustrative example of the layer to be processed which contains these metals includes Si, $SiO_2$, SiN, SiON, SiOC, p-Si, α-Si, TiN, WSi, BPSG, SOG, Cr, CrO, CrON, MoSi, W, W—Si, Al, Cu, Al—Si, various low dielectric film, and its etching stopper film. Here, the film thickness thereof is usually 50 to 10,000 nm, in particular 100 to 5,000 nm.

The positive chemically amplifying type photoresist film composition to form the photoresist film 2 is of a chemically amplifying type and contains an acid generator, wherein the composition is not particularly restricted so far as it can form a negative pattern by development with an organic solvent developer; however, it is preferable that the composition contain a resin having a repeating unit shown by the following general formula (a1),

wherein $R^{101}$ represents a hydrogen atom or a methyl group. $R^{102}$ represents an acid labile group.

The monomer to obtain the repeating unit shown by the general formula (a1) having an acid labile group therein is shown by the following general formula (Ma1). Here, $R^{101}$ and $R^{102}$ represent the same meanings as before.

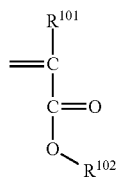

(Ma1)

Illustrative example of the above monomer may be found in the paragraphs [0083] to [0104] of the Japanese Patent Laid-Open Publication No. 2008-111103, while specific example thereof may be found in the paragraphs [0114] to [0117] therein.

The positive chemically amplifying type photoresist film composition used in the patterning process of the present invention contains an acid generator, for example, a compound that can generate an acid by responding to an active beam or a radiation beam (photo-sensitive acid generator). The acid generator component is not particularly restricted so far as it is a compound that can generate an acid by exposure to a high energy beam. Illustrative example of the preferable photo-sensitive acid generator includes a sulfonium salt, an iodonium salt, a sulfonyl diazomethane, a N-sulfonyl oxyimide, and an oxime-O-sulfonate acid generator. These may be used singly or as a mixture of two or more of them. Specific example of the acid generator may be found in the paragraphs [0122] to [0142] in the Japanese Patent Laid-Open Publication No. 2008-111103.

Photo-exposure is done by using a high energy beam of the wavelength ranging from 140 to 250 nm; especially photo-exposure by an ArF excimer laser beam of 193 nm is used most preferably. The dose amount of the photo-exposure is in the range of about 1 to 200 mJ/cm², or preferably in the range of about 10 to 100 mJ/cm². Thereafter, it is preferable to carry out the post exposure bake (PEB) on a hot plate in the temperature range of 60 to 150° C. and for the time range of 1 to 5 minutes, or more preferably in the temperature range of 80 to 120° C. and for the time range of 1 to 3 minutes.

Usually a positive photoresist film composition forms a photoresist film; and after photo-exposure, an alkaline development is carried out to dissolve the exposed part thereby giving a positively developed pattern. In the present invention, the photoresist film is formed by using a positive chemically amplifying type photoresist film composition; and after photo-exposure, development (negative development) is carried out by using an organic solvent thereby leaving the exposed part thereof undissolved to form a negatively developed pattern. By so doing, a finer pattern can be obtained as compared with a conventional positively developed pattern using an alkaline developer or a negatively developed pattern by using a conventional negative photoresist material. In this case, the obtained pattern is the exposed part so that a large amount of an acid from the acid generator is contained therein.

Illustrative example of the organic solvent used for negative development of the positive photoresist film 2 includes 2-octanone, 2-nonanone, 2-heptanone, 3-heptanone, 4-heptanone, 2-hexanone, 3-hexanone, diisobutyl ketone, methyl cyclohexanone, acetophenone, methyl acetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, wherein it is preferable to use a developer having the foregoing one, or two or more developer components contained therein with the total amount thereof being 50% or more by mass in order to remedy the pattern fall and so forth.

In addition, in the step (1), the organic underlayer film 4 may be formed between the substrate to be processed 1 and the photoresist film 2.

The organic underlayer film 4 is not particularly restricted, though the one which can express a sufficient function as the antireflective film during the time of photo-exposure of the photoresist film is preferable. Alternatively, an antireflective film may be formed between the organic underlayer film 4 and the photoresist film 2.

As to the organic film 4, it needs to act as an etching mask during the time of processing of the substrate to be processed by etching; and thus, it is preferable to use a material having a higher etching selectivity as compared with the substrate, and thus, specifically a material having an aromatic skeleton is preferable. Many organic films as the underlayer film mentioned above have been in the public domain as the underlayer film for a three-layer resist method or for a two-layer resist method which uses a silicon-containing resist composition; and thus, many resins including a novolak resin such as 4,4'-(9H-fluorene-9-ylidene)bisphenol novolak resin (molecular weight of 11,000) described in the Japanese Patent Laid-Open publication No. 2005-128509 have been in the public domain as the resist underlayer film material for the two-layer and the three-layer resist processes, so that any of them may be used.

When a higher heat resistance as compared with an usual novolak resin is wanted, illustrative example of the resin like this includes a resin having a skeleton such as a naphthalene compound, an acenaphthylene compound, a naphthol compound, and a bisnaphthol compound. For example, those resins disclosed in the Japanese Patent Laid-Open Publication No. 2007-199653 may be mentioned. In addition, a polyimide resin may be chosen (for example, those resins shown in the Japanese Patent Laid-Open Publication No. 2004-153125). In the case that the organic film is formed at low temperature, a hydroxystyrene resin may also be chosen; and in this case, introduction of a polycyclic skeleton thereinto is effective to increase its etching resistance, so that, for example, indene or fluorene may be copolymerized with it.

The organic underlayer film 4 as mentioned above may be formed conveniently so as to give uniform film thickness by a spin coating method.

Alternatively, a film containing a metal oxide may be used as the underlayer film formed between the substrate to be processed 1 and the photoresist film 2.

As to the film containing a metal oxide like this, a film which can be formed on the substrate to be processed by a spin coating method, similarly to the organic underlayer film, by using a composition for forming the film containing a metal oxide may be exemplified. After spin coating, it is preferable to carry out baking in order to evaporate the solvent, to avoid mixing with the upper photoresist film, and to facilitate the crosslinking reaction. This baking is done preferably in the temperature range of 50 to 500° C. and the time of 10 to 300 seconds. The especially preferable temperature range thereof is 400° C. or lower in order to decrease a thermal damage to a device, though the temperature is depending on structure of the device to be manufactured.

In the step (2), the silicon-containing film 3 is formed on the substrate to be processed 1 having thereon the negatively developed pattern 2' by applying a silicon-containing film composition comprising a silicon-containing compound capable of becoming insoluble in a solvent by a heat, an acid, or both and a solvent not dissolving the negatively developed pattern.

As to the silicon-containing compound contained in the silicon-containing film composition to form the silicon-containing film 3, illustrative example thereof includes at least a compound shown by the following general formula (A-1), and a compound shown by the following general formula (A-2) or a compound shown by the following general formula (A-3), or both of them, or a hydrolysate or a condensate of a mixture of the both, $$R^1_{m1}R^2_{m2}R^3_{m3}Si(R^0_{(4-m1-m2-m3)}) \quad (A-1)$$

wherein $R^0$ represents a halogen atom or a hydrolysable group having 1 to 6 carbon atoms; and $R^1$, $R^2$, and $R^3$ represent a hydrogen atom or a monovalent organic group having 1 to 30 carbon atoms optionally containing a silicon atom, wherein at least one of $R^1$, $R^2$, and $R^3$ represents preferably a substituent group that can generate a phenolic hydroxyl group, a naphthol hydroxyl group, or both by a heat, an acid, or both. Here, m1, m2, and m3 represent 0 or 1 with $1 \leq m1+m2+m3 \leq 3$, $$R^4_{m4}R^5_{m5}R^6_{m6}Si(OR^0)_{(4-m4-m5-m6)} \quad (A-2)$$

wherein $R^0$ represents the same meaning as before; and $R^4$, $R^5$, and $R^5$ represent a hydrogen atom or a monovalent organic group having 1 to 30 carbon atoms. Here, m4, m5, and m6 represent 0 or 1 with $0 \leq m4+m5+m6 \leq 3$, $$L(OR^7)_{m7}(OR^8)_{m8}(O)_{m9} \quad (A-3)$$

wherein $R^7$ and $R^8$ represent an organic group having 1 to 30 carbon atoms; $m7+m8+m9\times2$ is a valency that is determined by the kind of L. Here, m7, m8, and m9 represent an integer of 0 or more; and L is an element belonging to the groups of III, IV, or V in the periodic table except for carbon.

The foregoing L is preferably boron, aluminum, gallium, yttrium, germanium, titanium, zirconium, hafnium, bismuth, tin, phosphorous, vanadium, arsenic, antimony, niobium, or tantalum.

Followings may be mentioned as the preferable substituent group that can generate the phenolic hydroxyl group, the naphthol hydroxyl group, or both in the general formula (A-1) used as the raw material for the silicon-containing compound used in the present invention. Meanwhile, in the following formulae, (Si) shows the bonding site with Si.

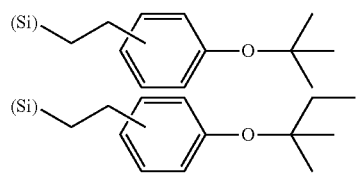

-continued

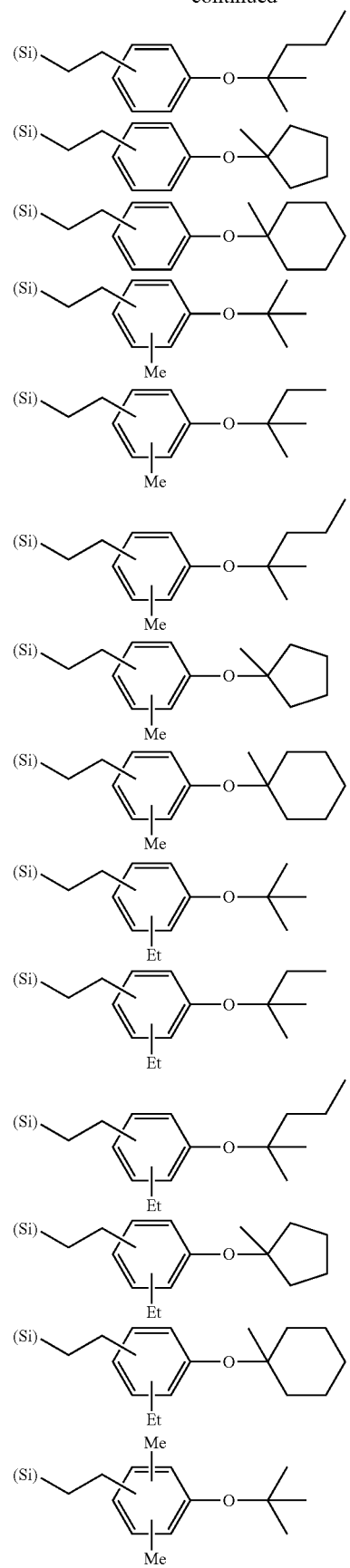

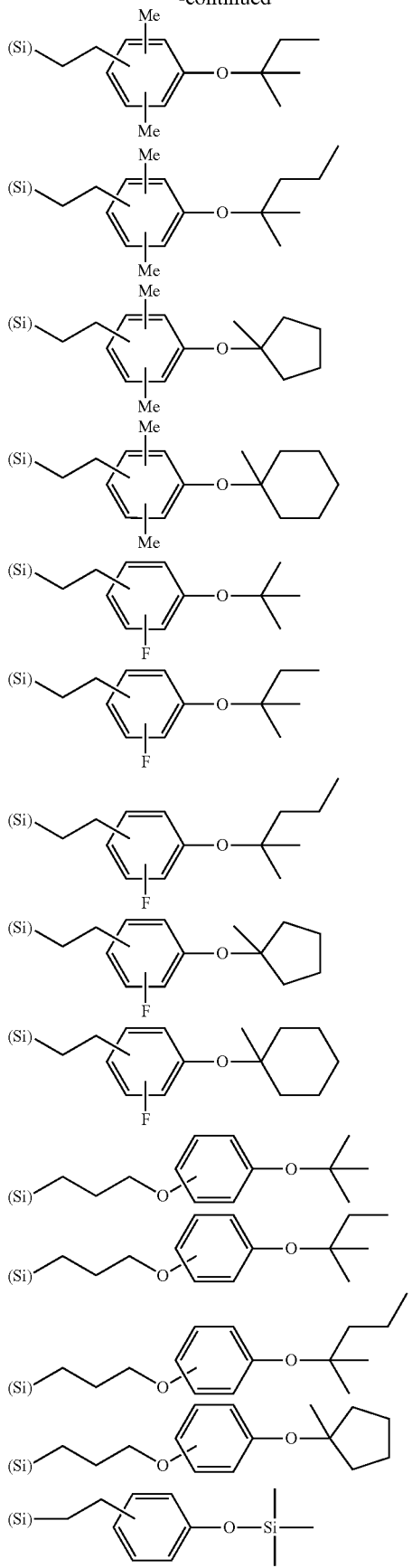
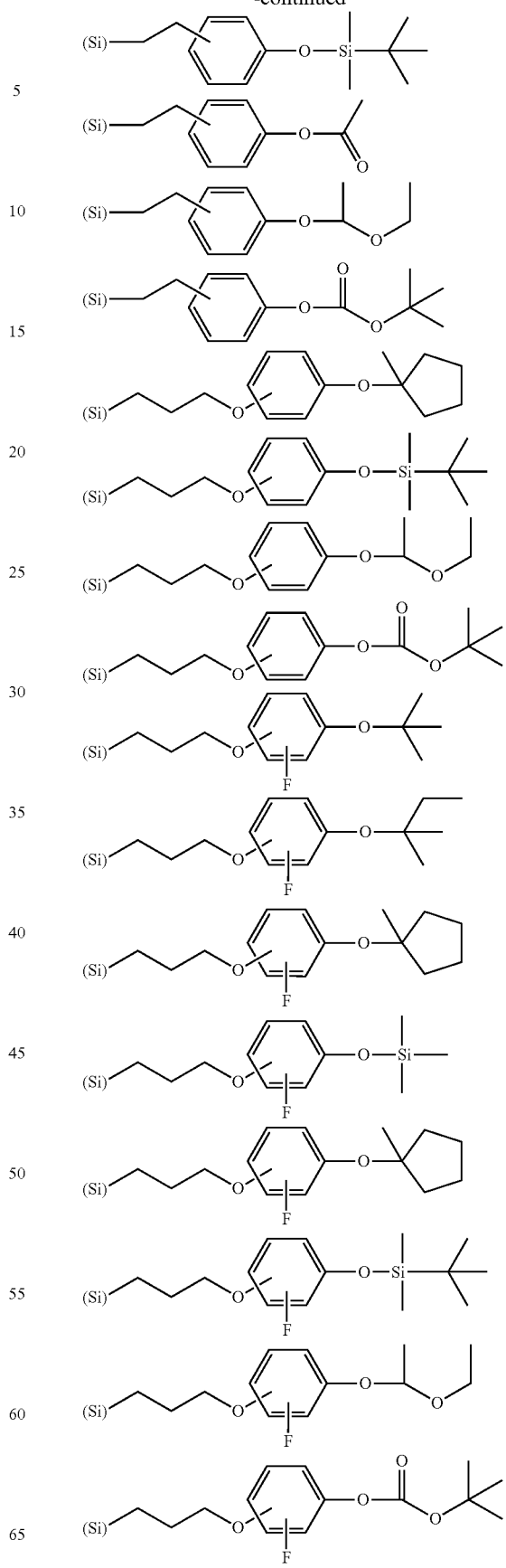

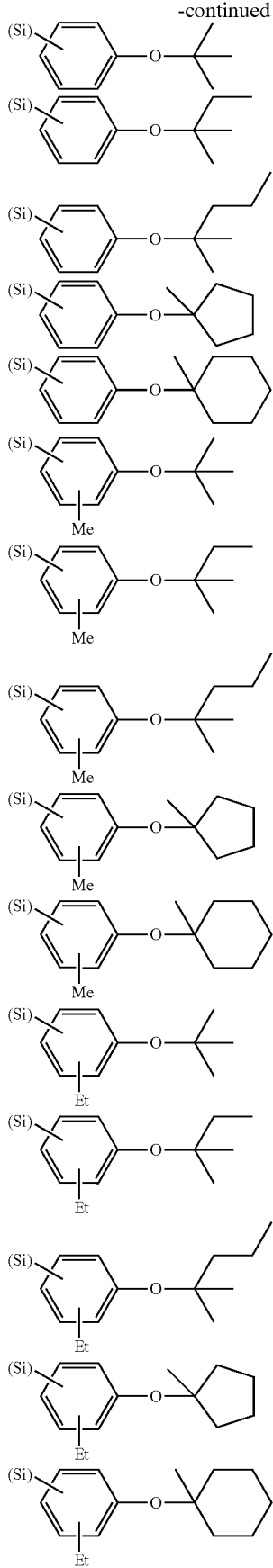
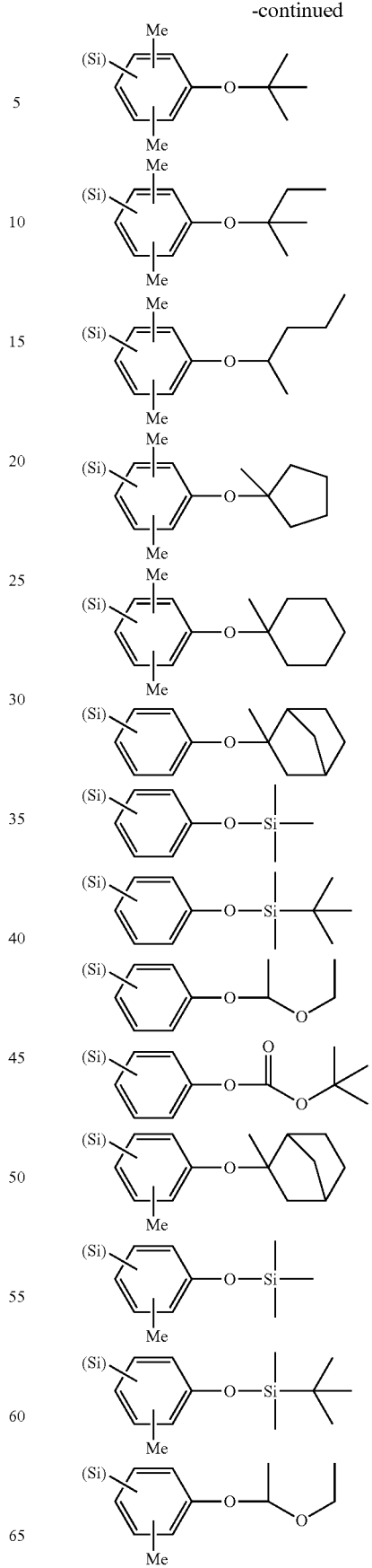

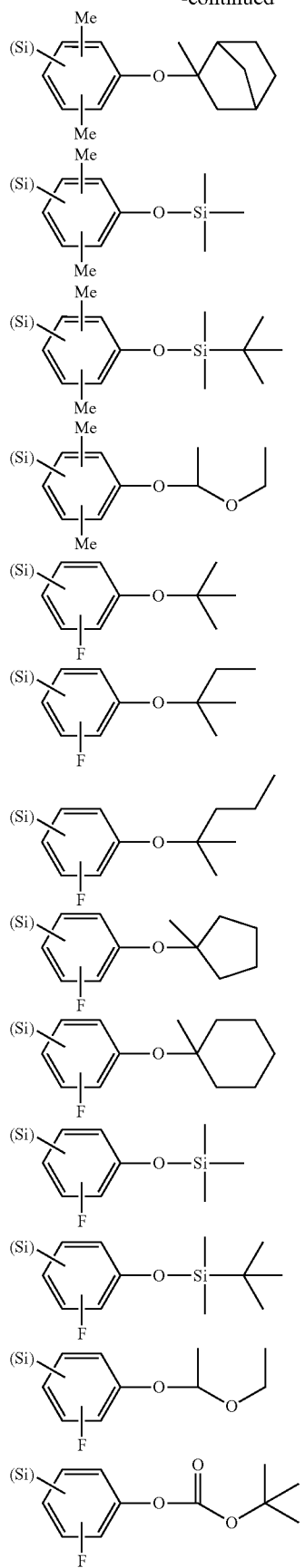
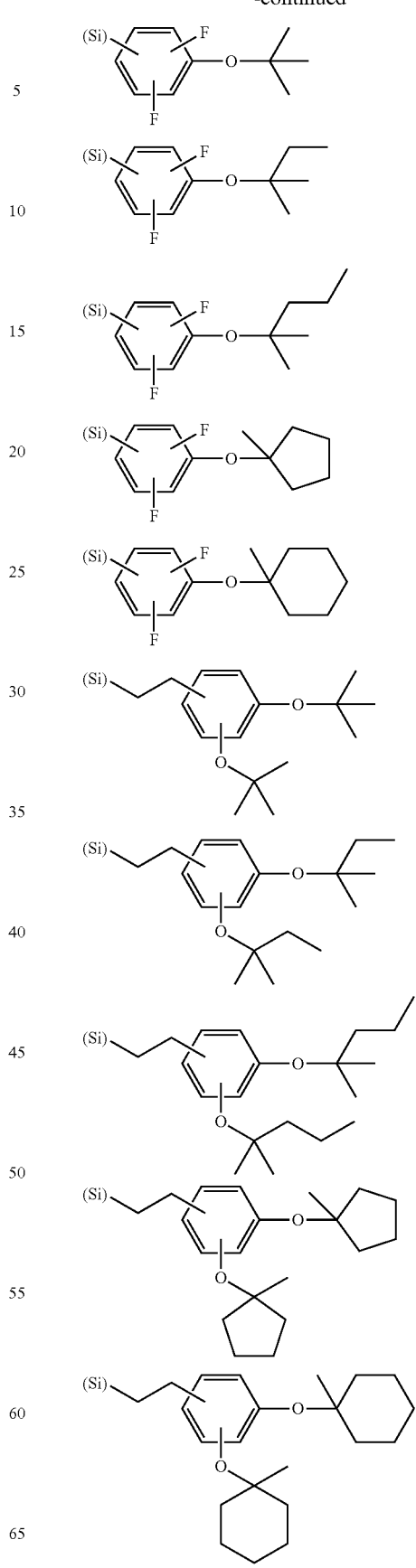

-continued
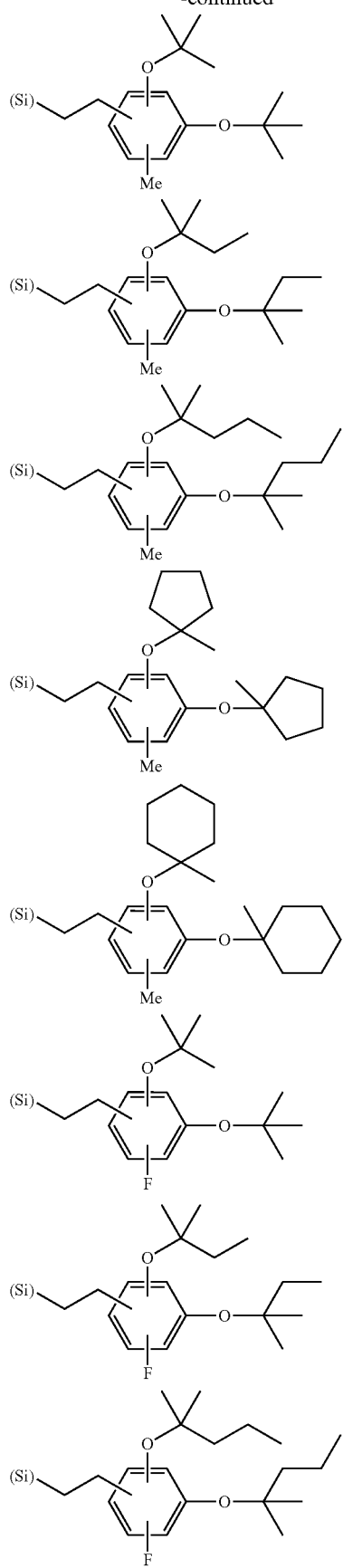
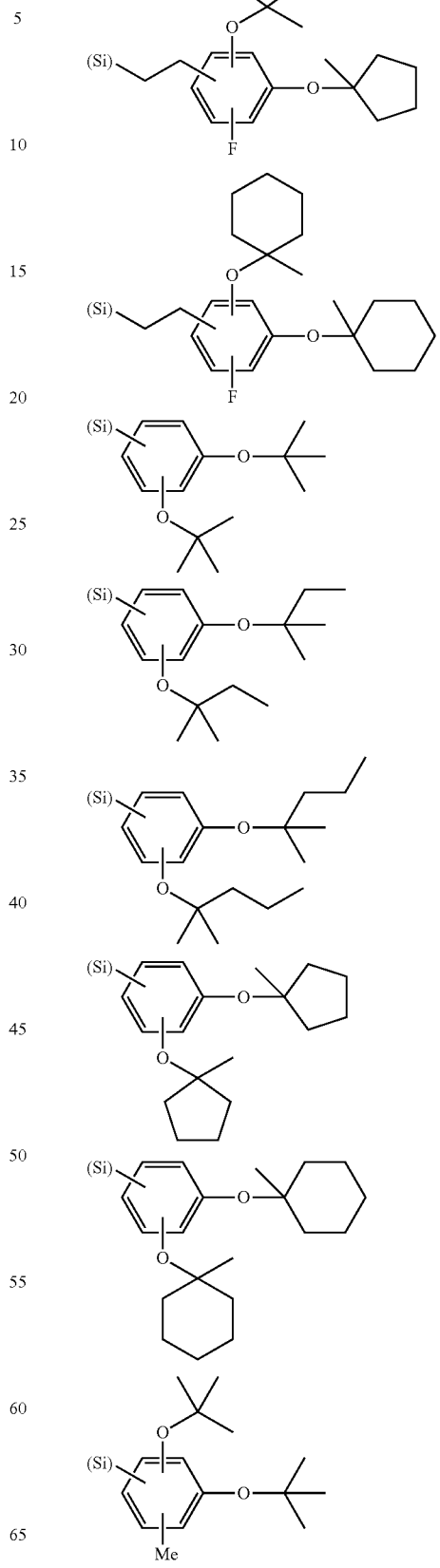

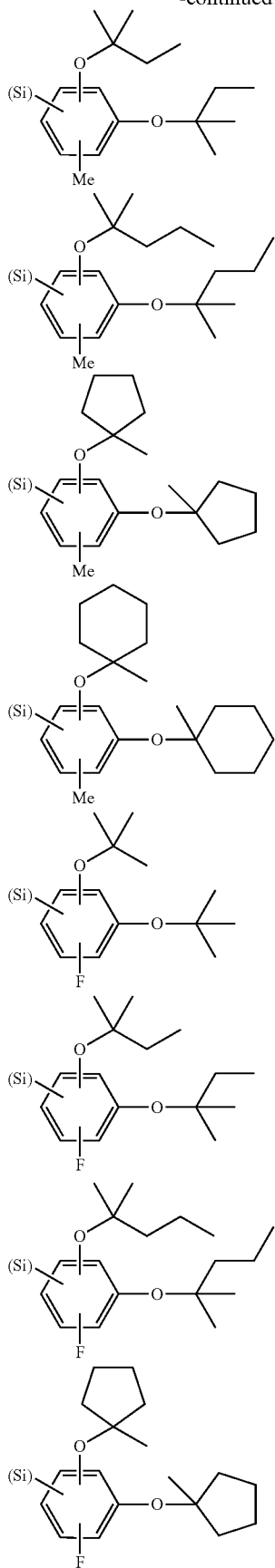
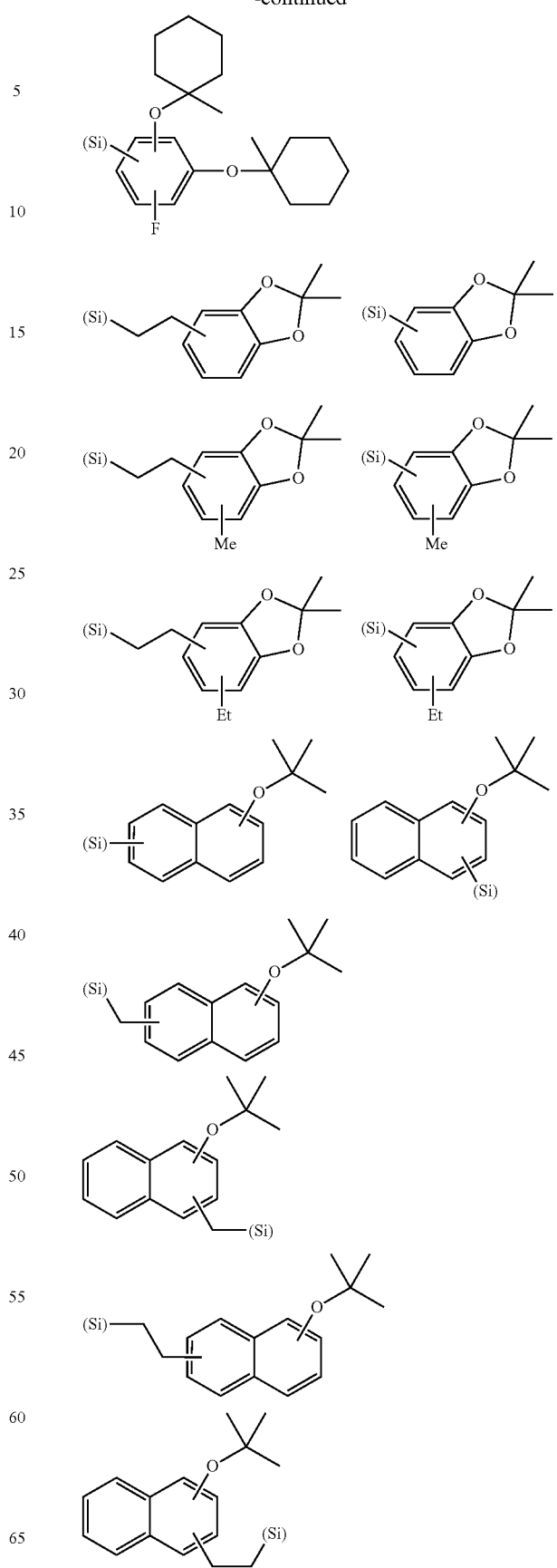

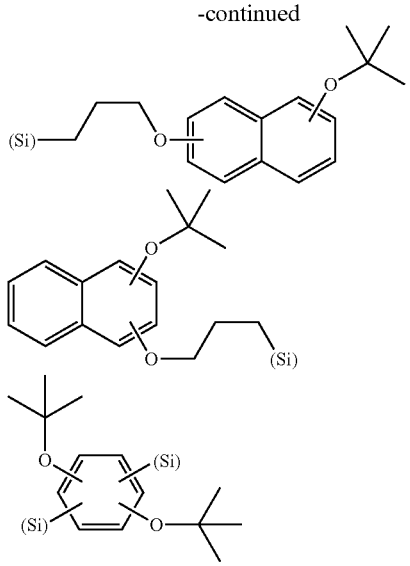

As to the hydrolysable monomer shown by the general formula (A-1) that is used as a raw material for the silicon-containing compound used in the present invention, a compound having the foregoing structure on the silicon atom thereof and containing, as $R^0$, a group such as chlorine, bromine, iodine, an acetoxy group, a methoxy group, an ethoxy group, an propoxy group, and a butoxy group, and as $R^2$ and $R^3$, a hydrogen atom or a monovalent organic group having 1 to 30 carbon atoms may be used.

Further, an organic group having one or more carbon-oxygen single bond or carbon-oxygen double bond may be mentioned as other example of the organic groups shown by $R^1$, $R^2$, and $R^3$ in the general formula (A-1). Specific example thereof is one or more group selected from the group consisting of an epoxy ring, an oxetane ring, an ester group, an alkoxy group, and a hydroxyl group, while an group having an epoxy ring or an oxetane ring is preferable. Illustrative example of the organic group having one or more carbon-oxygen single bond or carbon-oxygen double bond in the general formula (A-1) includes the group shown by the following general formula (2).

$$(P-Q_1-(S_1)_{v1}-Q_2-)_u-(T)_{v2}-Q_3-(S_2)_{v3}-Q_4- \quad (2)$$

wherein P represents a hydrogen atom, a hydroxyl group, a group having an epoxy ring shown by the following formula,

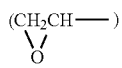

a group having an oxetane ring, an alkoxy group having 1 to 4 carbon atoms, an alkylcarbonyloxy group having 1 to 6 carbon atoms, or an alkylcarbonyl group having 1 to 6 carbon atoms; each of $Q_1$, $Q_2$, $Q_3$, and $Q_4$ independently represents —$C_qH_{(2q-p)}P_p$— (in the formula P represents the same meaning as before; p represents an integer of 0 to 3; and q represents an integer of 0 to 10); u represents an integer of 0 to 3; and each of $S_1$ and $S_2$ independently represents —O—, —CO—, —OCO—, —COO—, or —OCOO—. Each of v1, v2, and v3 independently represents 0 or 1. Concurrently with the above, T represents an alicyclic or an aromatic divalent group, and illustrative example of T is shown below. In T, the bonding sites to $Q_2$ and to $Q_3$ are not particularly restricted; and these sites are appropriately chosen by considering reactivity due to a steric factor, availability of a commercially sold reagent, and so on.

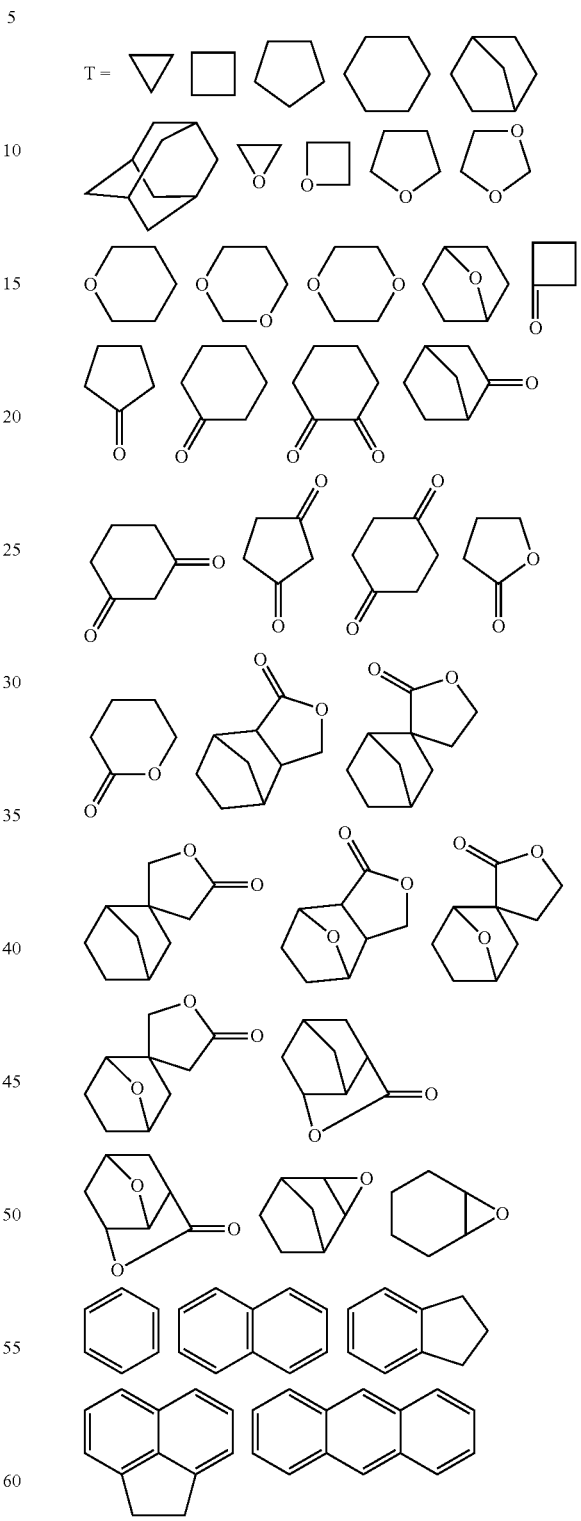

Preferable example of the organic group having one or more carbon-oxygen single bond or carbon-oxygen double bond in the general formula (A-1) includes those shown below.

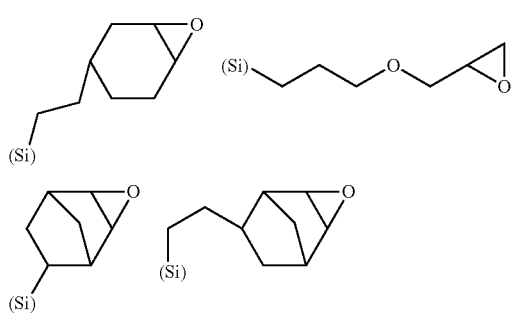
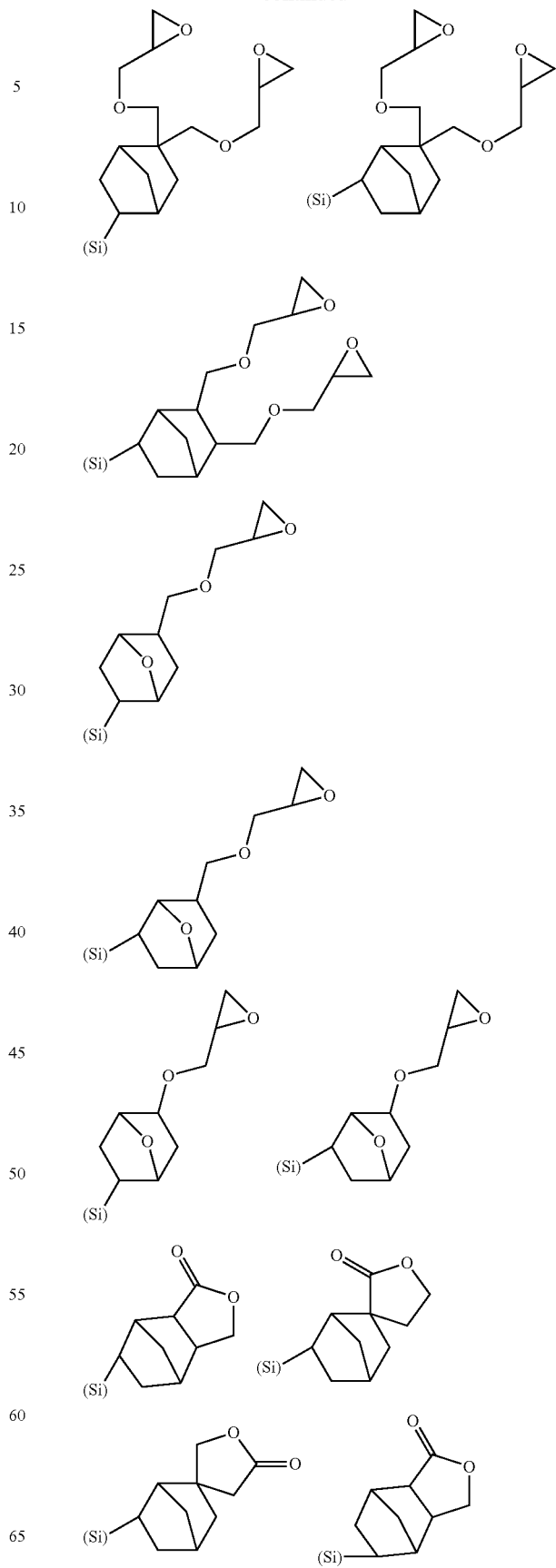

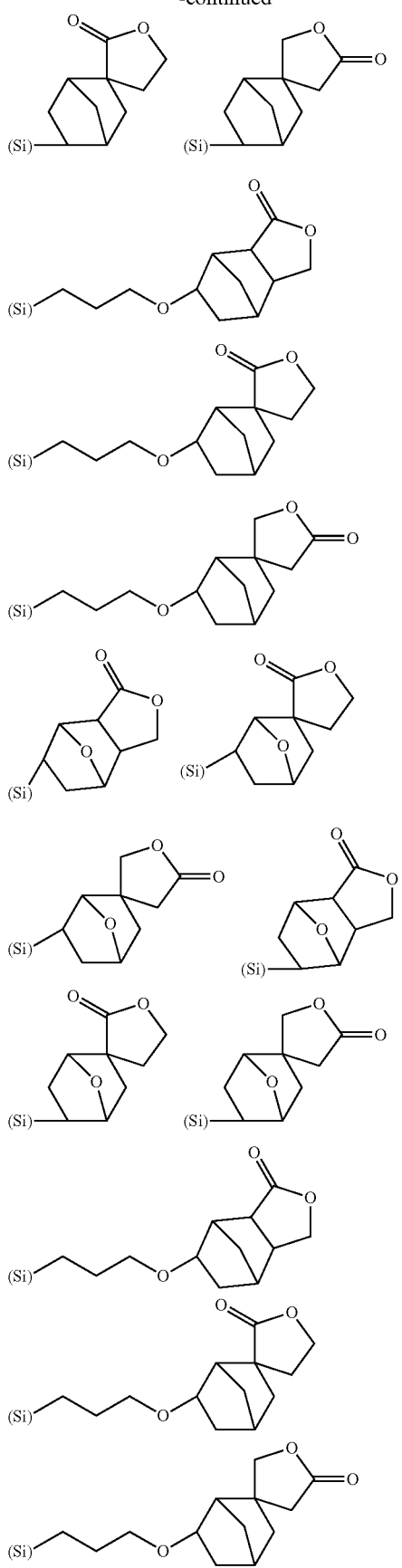
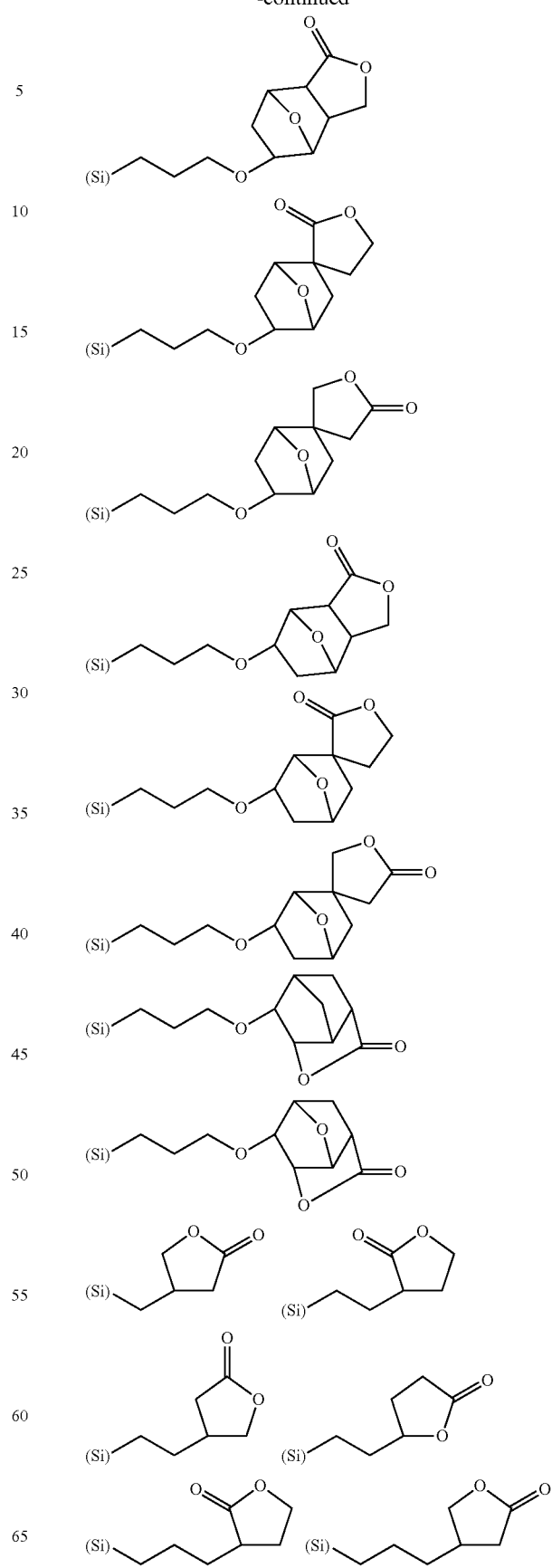

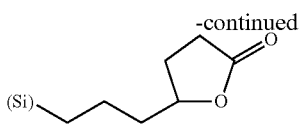

Illustrative example of the compound shown by the general formula (A-2) that is used as a raw material for the silicon-containing compound used in the present invention includes those shown below.

Trimethoxy silane, triethoxy silane, tripropoxy silane, triisopropoxy silane, methyl trimethoxy silane, methyl triethoxy silane, methyl tripropoxy silane, methyl triisopropoxy silane, ethyl trimethoxy silane, ethyl triethoxy silane, ethyl tripropoxy silane, ethyl triisopropoxy silane, vinyl trimethoxy silane, vinyl triethoxy silane, vinyl tripropoxy silane, vinyl triisopropoxy silane, propyl trimethoxy silane, propyl triethoxy silane, propyl tripropoxy silane, propyl triisopropoxy silane, isopropyl trimethoxy silane, isopropyl triethoxy silane, isopropyl tripropoxy silane, isopropyl triisopropoxy silane, butyl trimethoxy silane, butyl triethoxy silane, butyl tripropoxy silane, butyl triisopropoxy silane, sec-butyl trimethoxy silane, sec-butyl triethoxy silane, sec-butyl tripropoxy silane, sec-butyl triisopropoxy silane, t-butyl trimethoxy silane, t-butyl triethoxy silane, t-butyl tripropoxy silane, t-butyl triisopropoxy silane, cyclopropyl trimethoxy silane, cyclopropyl triethoxy silane, cyclopropyl tripropoxy silane, cyclopropyl triisopropoxy silane, cyclobutyl trimethoxy silane, cyclobutyl triethoxy silane, cyclobutyl tripropoxy silane, cyclobutyl triisopropoxy silane, cyclopentyl trimethoxy silane, cyclopentyl triethoxy silane, cyclopentyl tripropoxy silane, cyclopentyl triisopropoxy silane, cyclohexyl trimethoxy silane, cyclohexyl triethoxy silane, cyclohexyl tripropoxy silane, cyclohexyl triisopropoxy silane, cyclohexenyl trimethoxy silane, cyclohexenyl triethoxy silane, cyclohexenyl tripropoxy silane, cyclohexenyl triisopropoxy silane, cyclohexenylethyl trimethoxy silane, cyclohexenylethyl triethoxy silane, cyclohexenylethyl tripropoxy silane, cyclohexenylethyl triisopropoxy silane, cyclooctyl trimethoxy silane, cyclooctyl triethoxy silane, cyclooctyl tripropoxy silane, cyclooctyl triisopropoxy silane, cyclopentadienylpropyl trimethoxy silane, cyclopentadienylpropyl triethoxy silane, cyclopentadienylpropyl tripropoxy silane, cyclopentadienylpropyl triisopropoxy silane, bicycloheptenyl trimethoxy silane, bicycloheptenyl triethoxy silane, bicycloheptenyl tripropoxy silane, bicycloheptenyl triisopropoxy silane, bicycloheptyl trimethoxy silane, bicycloheptyl triethoxy silane, bicycloheptyl tripropoxy silane, bicycloheptyl triisopropoxy silane, adamantyl trimethoxy silane, adamantyl triethoxy silane, adamantyl tripropoxy silane, adamantyl triisopropoxy silane, phenyl trimethoxy silane, phenyl triethoxy silane, phenyl tripropoxy silane, phenyl triisopropoxy silane, benzyl trimethoxy silane, benzyl triethoxy silane, benzyl tripropoxy silane, benzyl triisopropoxy silane, tolyl trimethoxy silane, tolyl triethoxy silane, tolyl tripropoxy silane, tolyl triisopropoxy silane, anisyl trimethoxy silane, anisyl triethoxy silane, anisyl tripropoxy silane, anysyl triisopropoxy silane, phenetyl trimethoxy silane, phenetyl triethoxy silane, phenetyl tripropoxy silane, phenetyl triisopropoxy silane, naphthyl trimethoxy silane, naphthyl triethoxy silane, naphthyl tripropoxy silane, naphthyl triisopropoxy silane, dimethyl dimethoxy silane, dimethyl diethoxy silane, methyl ethyl dimethoxy silane, methyl ethyl diethoxy silane, dimethyl dipropoxy silane, dimethyl diisopropoxy silane, diethyl dimethoxy silane, diethyl diethoxy silane, diethyl dipropoxy silane, diethyl diisopropoxy silane, dipropyl dimethoxy silane, dipropyl diethoxy silane, dipropyl dipropoxy silane, dipropyl diisopropoxy silane, diisopropyl dimethoxy silane, diisopropyl diethoxy silane, diisopropyl dipropoxy silane, diisopropyl diisopropoxy silane, dibutyl dimethoxy silane, dibutyl diethoxy silane, dibutyl dipropoxy silane, dibutyl diisopropoxy silane, di-sec-butyl dimethoxy silane, di-sec-butyl diethoxy silane, di-sec-butyl dipropoxy silane, di-sec-butyl diisopropoxy silane, di-t-butyl dimethoxy silane, di-t-butyl diethoxy silane, di-t-butyl dipropoxy silane, di-t-butyl diisopropoxy silane, dicyclopropyl dimethoxy silane, dicyclopropyl diethoxy silane, dicyclopropyl dipropoxy silane, dicyclopropyl diisopropoxy silane, dicyclobutyl dimethoxy silane, dicyclobutyl diethoxy silane, dicyclobutyl dipropoxy silane, dicyclobutyl diisopropoxy silane, dicyclopentyl dimethoxy silane, dicyclopentyl diethoxy silane, dicyclopentyl dipropoxy silane, dicyclopentyl diisopropoxy silane, dicyclohexyl dimethoxy silane, dicyclohexyl diethoxy silane, dicyclohexyl dipropoxy silane, dicyclohexyl diisopropoxy silane, dicyclohexenyl dimethoxy silane, dicyclohexenyl diethoxy silane, dicyclohexenyl dipropoxy silane, dicyclohexenyl diisopropoxy silane, dicyclohexenylethyl dimethoxy silane, dicyclohexenylethyl diethoxy silane, dicyclohexenylethyl dipropoxy silane, dicyclohexenylethyl diisopropoxy silane, dicyclooctyl dimethoxy silane, dicyclooctyl diethoxy silane, dicyclooctyl dipropoxy silane, dicyclooctyl diisopropoxy silane, dicyclopentadienylpropyl dimethoxy silane, dicyclopentadienylpropyl diethoxy silane, dicyclopentadienylpropyl dipropoxy silane, dicyclopentadienylpropyl diisopropoxy silane, bis(bicycloheptenyl) dimethoxy silane, bis(bicycloheptenyl) diethoxy silane, bis(bicycloheptenyl) dipropoxy silane, bis(bicycloheptenyl) diisopropoxy silane, bis(bicycloheptyl) dimethoxy silane, bis(bicycloheptyl) diethoxy silane, bis(bicycloheptyl) dipropoxy silane, bis(bicycloheptyl) diisopropoxy silane, diadamantyl dimethoxy silane, diadamantyl diethoxy silane, diadamantyl dipropoxy silane, diadamantyl diisopropoxy silane, diphenyl dimethoxy silane, diphenyl diethoxy silane, methyl phenyl dimethoxy silane, methyl phenyl diethoxy silane, diphenyl dipropoxy silane, diphenyl diisopropoxy silane, trimethyl methoxy silane, trimethyl ethoxy silane, dimethyl ethyl methoxy silane, dimethyl ethyl ethoxy silane, dimethyl phenyl methoxy silane, dimethyl phenyl ethoxy silane, dimethyl benzyl methoxy silane, dimethyl benzyl ethoxy silane, dimethyl phenethyl methoxy silane, and dimethyl phenethyl ethoxy silane.

Illustrative example of the compound shown by the general formula (A-3), which is used as a raw material for the silicon-containing compound of the present invention, includes those shown below.

When L is boron, illustrative example of the compound thereof includes boron methoxide, boron ethoxide, boron propoxide, boron butoxide, boron amyloxide, boron hexyloxide, boron cyclopentoxide, boron cyclohexyloxide, boron allyloxide, boron phenoxide, and boron methoxyethoxide.

When L is aluminum, illustrative example of the compound as the monomer thereof includes aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxyethyl acetoacetate, aluminum dibutoxyethyl acetoacetate, aluminum propoxy bisethyl acetoacetate, aluminum butoxy bisethyl acetoacetate, aluminum 2,4-pentanedionate, and aluminum 2,2,6,6-tetramethyl-3,5-heptanedionate.

When L is gallium, illustrative example of the compound as the monomer thereof includes gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxyethyl acetoacetate, gallium dibutoxyethyl acetoacetate, gallium propoxy bisethyl acetoacetate, gallium butoxy bisethyl acetoacetate, gallium 2,4-pentanedionate, and gallium 2,2,6,6-tetramethyl-3,5-heptanedionate.

When L is yttrium, illustrative example of the compound as the monomer thereof includes yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxyethyl acetoacetate, yttrium dibutoxyethyl acetoacetate, yttrium propoxy bisethyl acetoacetate, yttrium butoxy bisethyl acetoacetate, yttrium 2,4-pentanedionate, and yttrium 2,2,6,6-tetramethyl-3,5-heptanedionate.

When L is germanium, illustrative example of the compound as the monomer thereof includes germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, and germanium ethoxyethoxide.

When L is titanium, illustrative example of the compound as the monomer thereof includes titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy bisethyl acetoacetate, titanium dibutoxy bisethyl acetoacetate, titanium dipropoxy bis-2,4-pentanedionate, and titanium dibutoxy bis-2,4-pentanedionate.

When L is hafnium, illustrative example of the compound as the monomer thereof includes hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy bisethyl acetoacetate, hafnium dibutoxy bisethyl acetoacetate, hafnium dipropoxy bis-2,4-pentanedionate, and hafnium dibutoxy bis-2,4-pentanedionate.

When L is tin, illustrative example of the compound as the monomer thereof includes methoxy tin, ethoxy tin, propoxy tin, butoxy tin, phenoxy tin, methoxyethoxy tin, ethoxyethoxy tin, tin 2,4-pentanedionate, and tin 2,2,6,6-tetramethyl-3,5-heptanedionate.

When L is arsenic, illustrative example of the compound as the monomer thereof includes methoxy arsenic, ethoxy arsenic, propoxy arsenic, butoxy arsenic, and phenoxy arsenic.

When L is antimony, illustrative example of the compound as the monomer thereof includes methoxy antimony, ethoxy antimony, propoxy antimony, butoxy antimony, phenoxy antimony, antimony acetate, and antimony propionate.

When L is niobium, illustrative example of the compound as the monomer thereof includes methoxy niobium, ethoxy niobium, propoxy niobium, butoxy niobium, and phenoxy niobium.

When L is tantalum, illustrative example of the compound as the monomer thereof includes methoxy tantalum, ethoxy tantalum, propoxy tantalum, butoxy tantalum, and phenoxy tantalum.

When L is bismuth, illustrative example of the compound as the monomer thereof includes methoxy bismuth, ethoxy bismuth, propoxy bismuth, butoxy bismuth, and phenoxy bismuth.

When L is phosphorous, illustrative example of the compound as the monomer thereof includes trimethyl phosphite, triethyl phosphite, tripropyl phosphite, trimethyl phosphate, triethyl phosphate, tripropyl phosphate, and diphosphorous pentaoxide.

When L is vanadium, illustrative example of the compound as the monomer thereof includes vanadium oxide bis(2,4-pentanedionate), vanadium 2,4-pentanedionate, vanadium tributoxide oxide, and vanadium tripropoxide oxide.

When L is zirconium, illustrative example of the compound as the monomer thereof includes methoxy zirconium, ethoxy zirconium, propoxy zirconium, butoxy zirconium, phenoxy zirconium, zirconium dibutoxide bis(2,4-pentanedionate), and zirconium dipropoxide bis(2,2,6,6-tetramethyl-3, 5-heptanedionate).

The silicon-containing compound may be produced by carrying out the hydrolysis condensation reaction of these monomers in the presence of an acid catalyst or a base catalyst.

As to the acid catalyst used in this reaction, one or more compound selected from the group consisting of an inorganic acid, an aliphatic sulfonic acid, an aromatic sulfonic acid, an aliphatic carboxylic acid, and an aromatic carboxylic acid may be mentioned; and specific example thereof includes hydrofluoric acid, hydrochloric acid, hydrobromic acid, sulfuric acid, nitric acid, perchloric acid, phosphoric acid, methanesulfonic acid, benzenesulfonic acid, toluenesulfonic acid, formic acid, acetic acid, propionic acid, oxalic acid, malonic acid, maleic acid, fumaric acid, and benzoic acid.

Illustrative example of the base catalyst used in this reaction includes methylamine, ethylamine, propylamine, butylamine, ethylene diamine, hexamethylene diamine, dimethylamine, diethylamine, ethyl methyl amine, trimethylamine, triethylamine, tripropylamine, tributylamine, cyclohexylamine, dicyclohexylamine, monoethanol amine, diethanol amine, dimethyl monoethanol amine, monomethyl diethanol amine, triethanol amine, diazabicyclooctane, diazabicyclononene, diazabicycloundecene, hexamethylene tetraamine, aniline, N,N-dimethylaniline, pyridine, N,N-dimethylaminopyridine, pyrrole, piperazine, pyrrolidine, piperidine, picoline, tetramethyl ammonium hydroxide, cholin hydroxide, tetrapropyl ammonium hydroxide, tetrabutyl ammonium hydroxide, ammonia, lithium hydroxide, sodium hydroxide, potassium hydroxide, barium hydroxide, and calcium hydroxide.

Use amount of each catalyst is $10^{-6}$ to 10 moles, preferably $10^{-5}$ to 5 moles, and more preferably $10^{-4}$ to 1 mole, relative to 1 mole of the monomer.

Amount of water to obtain the silicon-containing compound by the hydrolysis condensation reaction of these monomers is preferably 0.01 to 100 moles, more preferably 0.05 to 50 moles, or still more preferably 0.1 to 30 moles, relative to 1 mole of the hydrolysable substituent group which is bonded to the monomer. When the amount is 100 moles or less, an excessively large equipment is not necessary for the reaction, so that it is economical and preferable.

Operational procedures to obtain the silicon-containing compound by the hydrolysis condensation reaction of these monomers may be found, for example, in paragraphs [0103]

to [0120] and [0142] to [0156] of the Japanese Patent Laid-Open Publication No. 2009-126940.

As to the preferable solvent which does not dissolve the negatively developed pattern and is contained in the silicon-containing film composition to form the silicon-containing film 3, those developers used during the time of negative development of the photoresist film may be mentioned. Illustrative example thereof includes 2-octanone, 2-nonanone, 2-heptanone, 3-heptanone, 4-heptanone, 2-hexanone, 3-hexanone, diisobutyl ketone, methyl cyclohexanone, acetophenone, methyl acetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, 2-phenylethyl acetate, and 4-methyl-2-pentanol, wherein it is preferable to use a developer having the foregoing one, or two or more developer components contained therein with the total amount thereof being 50% or more by mass in order to remedy pattern fall and so forth.

Molecular weight of the silicon-containing film composition can be controlled not only by selection of the monomer but also by control of the reaction condition during the time of polymerization. When the compound having weight-average molecular weight of more than 100,000 is used, foreign matters or coating smear may be formed in a certain instance; and thus, the weight-average molecular weight thereof is preferably 100,000 or less, more preferably in the range of 200 to 50,000, or still more preferably in the range of 300 to 30,000. Meanwhile, the data of the weight-average molecular weight are of the polystyrene-equivalent molecular weight based on the standard polystyrene, wherein the data are obtained by a gel permeation chromatography (GPC) using RI as the detector and tetrahydrofuran as the eluting solvent.

In the present invention, a crosslinking agent that can undergo a crosslinking reaction by action of an acid may be added in the silicon-containing film composition in order to further insolubilize the silicon-containing film in a solvent. A crosslinking agent like this can facilitate the crosslinking reaction by heating. Specifically, the agents described in the paragraphs of [0055] to [0060] of the Japanese Patent Laid-Open Publication No. 2007-199653 may be added.

In the present invention, the silicon-containing film composition may contain, if necessary, a heat-sensitive acid generator which further facilitates the crosslinking reaction by a heat. Any heat-sensitive acid generator may be added so far as it can generate an acid by pyrolysis. Specific example of the acid generator which can be used therein may be found in the paragraphs of [0061] to [0085] in the Japanese Patent Laid-Open Publication No. 2007-199653.

In the present invention, the silicon-containing film composition may contain, if necessary, a surfactant. Specific example of the surfactant which can be used therein may be found in the paragraph of [0185] in the Japanese Patent Laid-Open Publication No. 2009-126940.

In the step (3), the silicon-containing film 3 is insolubilized in a solvent in the vicinity of surface of the negatively developed pattern 2' by heating, an acid contained in the negatively developed pattern 2' as a catalyst, or both to obtain the insolubilized silicon-containing film 3'.

By so doing, a repeating structure comprising the negatively developed pattern 2', the solvent-insolubilized silicon-containing film 3', the silicon-containing film 3 not solvent-insolubilized, the solvent-insolubilized silicon-containing film 3', the negatively developed pattern 2', the solvent-insolubilized silicon-containing film 3' may be formed in this order horizontally.

Meanwhile, film thickness of the solvent-insolubilized silicon-containing film 3' may be controlled by adjusting the temperature and the time for the heat treatment after the silicon-containing film 3 fills the space between the neighboring negatively developed patterns 2'. To insolubilize in a solvent the vicinity of surface of the negatively developed pattern 2', comparatively low temperature is sufficient in the heat treatment; and thus, the temperature of the heat treatment is in the range of 30 to 200° C., or preferably 60 to 180° C., and the time thereof is in the range of 1 to 500 seconds, or preferably 1 to 300 seconds.

In the step (4), the non-insolubilized part of the silicon-containing film is removed by dissolving it in an organic solvent to obtain the insolubilized part thereof as the silicon-containing film pattern 3".

As to the organic solvent to remove by dissolving the non-insolubilized part of the silicon-containing film is not particularly restricted so far as it can dissolve this part; for example, those organic solvents used in development to obtain the negatively developed pattern 2' in the step (1) (FIG. 1(*d*) and FIG. 2(*e'*)) may be used.

In the step (5), the upper part of the silicon-containing film pattern 3" is dry-etched or wet-etched thereby forming the sidewall and exposing the upper part of the negatively developed pattern 2'.

The condition of dry-etching or wet-etching of the upper part of the silicon-containing film pattern 3" is not particularly restricted, but it is preferable to carry out the etching by using a gas system mainly comprising a gas of fluorine or fluorinated compound including a flon gas.

In the step (6), the negatively developed pattern 2' is removed by dry-etching or wet-etching.

The condition of dry-etching or wet-etching of the negatively developed pattern 2' is not particularly restricted, and the etching can be carried out without damaging the silicon-containing film pattern 3" by using a reactive dry-etching using an oxygen gas plasma; and this is preferable in the case of forming the organic underlayer film 4 as mentioned later because the organic underlayer film 4 can be etched simultaneously.

In the step (7), the pattern is transferred to the substrate to be processed 1 by using, as an etching mask, the silicon-containing film pattern 3" whose upper part is dry-etched or wet-etched (FIG. 1(*j*)). In the case that the organic underlayer film 4 is formed in the step (1), the pattern is transferred to the organic underlayer film 4 (FIG. 2(*k'*)).

In the case that the organic underlayer film 4 is formed in the step (1), the pattern is transferred to the substrate to be processed 1 by using the organic underlayer film 4 as an etching mask in the step (8) (FIG. 2(*l'*).

There is no particular restriction as to the method for transferring the pattern to the organic underlayer film 4; however, the reactive dry etching by an oxygen gas plasma as mentioned before is preferable because this can be done simultaneously with etching of the negatively developed pattern 2'.

The method for transferring the pattern to the substrate to be processed 1 is not particularly restricted, though the substrate to be processed 1 can be processed highly precisely for the pattern transfer by using, for example, a fluorine dry etching or a chlorine dry etching.

According to the patterning process as mentioned above, the pattern having the pattern pitch of the photoresist film at the time of photo-exposure halved can be transferred to the substrate to be processed.

EXAMPLES

Hereinafter, the present invention will be explained specifically by showing Synthesis Examples and Examples; but the present invention is not limited by these descriptions.

Meanwhile, "%" shown in Examples indicates "% by mass", and molecular weights are shown by the polystyrene equivalent value measured by GPC.

Synthesis Example A-1

Into the mixture of 200 g methanol, 0.1 g of methanesulfonic acid, and 60 g of deionized water were added 54.5 g of the compound shown by [Monomer 101] and 29.8 g of the compound shown by [Monomer 120]. This resulting mixture was kept at 40° C. for 12 hours to carry out the hydrolysis condensation reaction. After the reaction, the by-produced alcohol was removed by distillation under reduced pressure. Then, 1500 mL of butyl acetate (BA) was added thereinto; and the resulting water layer was separated. Into the remaining organic layer was added 100 mL of ion-exchanged water; and the resulting mixture was stirred, settled, and separated into the layers. This procedure was repeated for three times. The remaining organic layer was concentrated under reduced pressure to obtain 250 g of the BA solution of the silicon-containing compound A-1 having the organic group whose phenolic hydroxyl group was protected was obtained (compound concentration of 20%). The polystyrene equivalent molecular weight of this compound was measured to be 1900 (Mw).

Synthesis Examples A-2 to A-11 were carried out by using the monomers shown in Table 1 under the condition same as that of Synthesis Example A-1 to obtain respective intended products.

Synthesis Example A-12

Into the mixture of 200 g methanol, 0.1 g of 10% hydrochloric acid, and 60 g of deionized water were added 47.7 g of the compound shown by [Monomer 101] and 48.1 g of the compound shown by [Monomer 123]. This resulting mixture was kept at 40° C. for 12 hours to carry out the hydrolysis condensation reaction. After the reaction, the by-produced alcohol was removed by distillation under reduced pressure. Then, 1500 mL of 4-methyl-2-pentanol (4M2P) was added thereinto; and the resulting water layer was separated. Into the remaining organic layer was added 100 mL of ion-exchanged water; and the resulting mixture was stirred, settled, and separated into the layers. This procedure was repeated for three times. The remaining organic layer was concentrated under reduced pressure to obtain 290 g of the 4M2P solution of the silicon-containing compound A-12 having the phenolic hydroxyl group was obtained (compound concentration of 20%). The polystyrene equivalent molecular weight of this compound was measured to be 2400 (Mw).

Synthesis Example A-13

Into the mixture of 400 g ethanol, 5 g of 25% tetramethyl ammonium hydroxide, and 200 g of deionized water were added 47.7 g of the compound shown by [Monomer 101] and 48.1 g of the compound shown by [Monomer 123]. This resulting mixture was kept at 40° C. for 4 hours to carry out the hydrolysis condensation reaction. After the reaction, 2 g of acetic acid was added for neutralization, and then the by-produced alcohol was removed by distillation under reduced pressure. Then, 1500 mL of BA was added thereinto; and the resulting water layer was separated. Into the remaining organic layer was added 100 mL of ion-exchanged water; and the resulting mixture was stirred, settled, and separated into the layers. This procedure was repeated for three times. The remaining organic layer was concentrated under reduced pressure to obtain 305 g of the BA solution of the silicon-containing compound A-13 (compound concentration of 20%). The polystyrene equivalent molecular weight of this compound was measured to be 2200 (Mw).

Synthesis Examples A-14 was carried out by using the monomers shown in Table 1 under the condition same as that of Synthesis Example A-13 to obtain the intended product.

TABLE 1

| Synthesis Example | Reaction raw material | Mw |
|---|---|---|
| A-1 | [Monomer 101] 54.5 g, [Monomer 120] 29.8 g | 1900 |
| A-2 | [Monomer 101] 34.1 g, [Monomer 120] 74.6 g | 2400 |
| A-3 | [Monomer 101] 20.4 g, [Monomer 120] 104.5 g | 2700 |
| A-4 | [Monomer 101] 40.9 g, [Monomer 102] 7.6 g, [Monomer 120] 44.8 g | 2800 |
| A-5 | [Monomer 101] 40.9 g, [Monomer 110] 9.4 g, [Monomer 120] 44.8 g | 2000 |
| A-6 | [Monomer 101] 40.9 g, [Monomer 111] 17 g, [Monomer 120] 44.8 g | 2300 |
| A-7 | [Monomer 101] 40.9 g, [Monomer 112] 18.3 g, [Monomer 120] 44.8 g | 1900 |
| A-8 | [Monomer 101] 40.9 g, [Monomer 113] 14.2 g, [Monomer 120] 44.8 g | 2700 |
| A-9 | [Monomer 101] 40.9 g, [Monomer 114] 16.2 g, [Monomer 120] 44.8 g | 2700 |
| A-10 | [Monomer 101] 47.7 g, [Monomer 121] 40.6 g | 1900 |
| A-11 | [Monomer 101] 47.7 g, [Monomer 122] 48.1 g | 1900 |
| A-12 | [Monomer 101] 47.7 g, [Monomer 123] 48.1 g | 2400 |
| A-13 | [Monomer 101] 47.7 g, [Monomer 123] 48.1 g | 2200 |
| A-14 | [Monomer 101] 20.4 g, [Monomer 124] 86.2 g | 2800 |

$CH_3Si(OCH_3)_3$:[Monomer 101] $Si(OC_2H_5)_4$:[Monomer 102] $B(OC_3H_7)_3$:[Monomer 110] $Ti(OC_4H_9)_4$:[Monomer 111] $Ge(OCH_4H_9)_4$:[Monomer 112] $P_2O_5$:[Monomer 113] $Al[CH_3COCH=C(O-)CH_3]_3$:[Monomer 114]

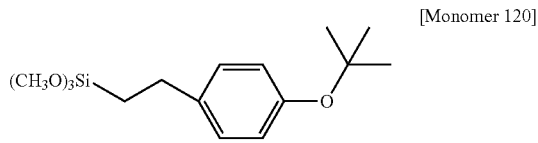

[Monomer 120]

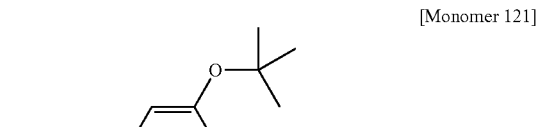

[Monomer 121]

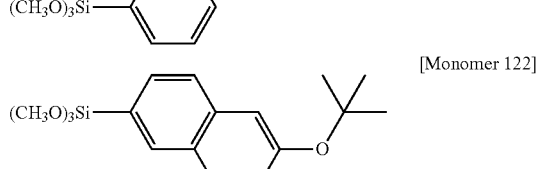

[Monomer 122]

-continued

[Monomer 123]

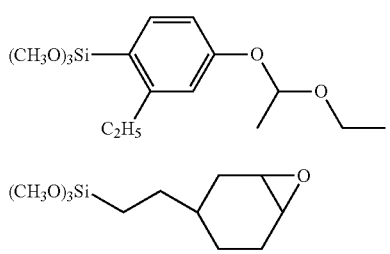

[Monomer 124]

Examples

Each of the silicon-containing compounds A-1 to A-14 obtained by the Synthesis Examples was mixed with the crosslinking agent and the solvent with the ratio as shown in Table 2; and the resulting mixture was filtered through a 0.1-μm filter made of a fluorinated resin to obtain each of the silicon-containing film composition solutions Sol. 1 to Sol. 17.

TABLE 2

| No. | Silicon-containing compound (parts by mass) | Crosslinking agent (parts by mass) | Solvent (parts by mass) |
| --- | --- | --- | --- |
| Sol. 1 | A-1(4.0) | CL-1 (0.4) | BA (200) |
| Sol. 2 | A-1(4.0) | CL-2 (0.4) | BA (200) |
| Sol. 3 | A-1(4.0) | CL-3 (0.4) | BA (200) |
| Sol. 4 | A-2(4.0) | CL-1 (0.4) | BA (200) |
| Sol. 5 | A-3(4.0) | CL-1 (0.4) | BA (200) |
| Sol. 6 | A-4(4.0) | CL-1 (0.4) | BA (200) |
| Sol. 7 | A-5(4.0) | CL-1 (0.4) | BA (200) |
| Sol. 8 | A-6(4.0) | CL-1 (0.4) | BA (200) |
| Sol. 9 | A-7(4.0) | CL-1 (0.4) | BA (200) |
| Sol. 10 | A-8(4.0) | CL-1 (0.4) | BA (200) |
| Sol. 11 | A-9(4.0) | CL-1 (0.4) | BA (200) |
| Sol. 12 | A-10(4.0) | CL-2 (0.4) | BA (200) |
| Sol. 13 | A-11(4.0) | CL-3 (0.4) | BA (200) |
| Sol. 14 | A-12(4.0) | CL-1 (0.4) | 4M2P (200) |
| Sol. 15 | A-13(4.0) | CL-1 (0.4) | BA (200) |
| Sol. 16 | A-14(4.0) | — | BA (200) |
| Sol. 17 | A-3(2.0) A-14(2.0) | — | BA (200) |

Crosslinking agent:

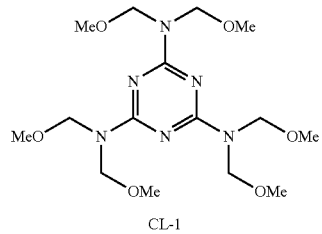 [SMILES: COCN(COC)c1nc(N(COC)COC)nc(N(COC)COC)n1]

CL-1

TABLE 2-continued

| No. | Silicon-containing compound (parts by mass) | Crosslinking agent (parts by mass) | Solvent (parts by mass) |
| --- | --- | --- | --- |

CL-2

CL-3

Patterning Test

The spin-on carbon film ODL-50 (carbon content of 80% by mass, manufactured by Shin-Etsu Chemical Co., Ltd.) on the silicon wafer (diameter of 12 inches (300 mm)) was baked at 350° C. for 60 seconds to form a film having film thickness of 200 nm. On it was applied a solution for an organic anti-reflective film (ARC-29A, manufactured by Nissan Chemical Industries, Ltd.), which was followed by baking it at 205° C. for 60 seconds to obtain a coat film having film thickness of 78 nm.

Then, a positive ArF resist solution for negative development (PR-1) shown in Table 3 was applied onto the anti-reflective film, and then it was baked at 100° C. for 60 seconds to form the photoresist film having film thickness of 100 nm. A solution of the immersion protection film (TC-1) was applied onto the photoresist film, and then it was baked at 90° C. for 60 seconds to form the top coat having the film thickness of 50 nm.

Then, this was subjected to photo-exposure by using an ArF immersion exposure instrument (NSR-S610C, with NA of 1.30, σ of 0.98/0.65, 35-degree dipole polarized illumination, and 6% half tone phase shift mask, manufactured by Nikon Corp.), and then it was baked at 100° C. for 60 seconds (PEB). After the butyl acetate developer was poured from the developer nozzle for 3 seconds while rotating the substrate at the rate of 30 rpm, it was puddle-developed for 27 seconds while stopping the rotation and then rinsed with diisoamyl ether. After spin-drying, baking was done at 100° C. for 20 seconds to evaporate the rinsing solvent.

By this patterning, a line-and-space pattern having the line width of 30 nm and the space width of 90 nm was obtained.

TABLE 3

| No. | Polymer (parts by mass) | Acid-generator (parts by mass) | Base (parts by mass) | Solvent (parts by mass) |
| --- | --- | --- | --- | --- |
| PR-1 | ArF resist polymer 1 (100) | PAG 1 (7.0) | Quencher (1.0) | PGMEA (2,500) |

ArF Resist Polymer 1:
  Molecular weight (Mw): 8,600
  Dispersity (Mw/Mn): 1.88

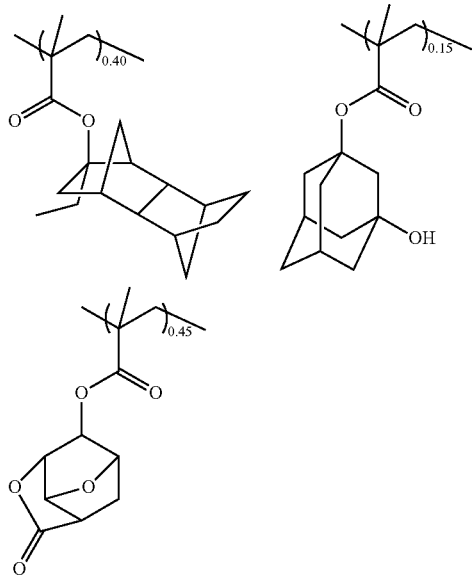

Acid generator: PAG 1

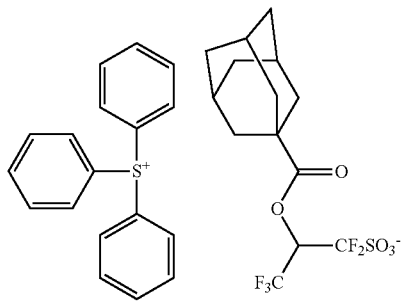

Base: Quencher

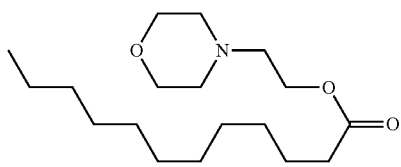 [SMILES: CCCCCCCCCCCC(=O)OCCN1CCOCC1]

TABLE 4

|  | Polymer (parts by mass) | Organic solvent (parts by mass) |
|---|---|---|
| TC-1 | Top coat polymer (100) | Diisoamyl ether (2700) 2-Methyl-1-butanol (270) |

Top Coat Polymer:
  Molecular weight (Mw): 8,800
  Dispersity (Mw/Mn): 1.69

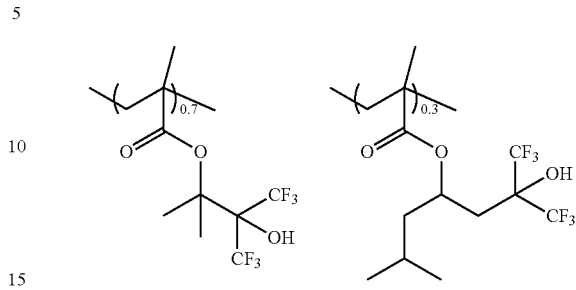

Then, the silicon-containing film composition shown in Table 2 was applied onto the wafer having the negatively developed pattern formed thereon. The wafer was baked at 120° C. for 60 seconds to insolubilize the silicon-containing film in the vicinity of surface of the negatively developed pattern by utilizing the acid contained in the negatively developed pattern. Subsequently, to remove the non-insolubilized part of the silicon-containing film, it was rinsed by butyl acetate. After rinsing, the formed silicon-containing film pattern was cured by heating at 150° C. for 60 seconds.

The upper part of the silicon-containing film pattern thus obtained was dry-etched under the condition (1) shown below; and then, it was dry-etched under the condition (2) shown below to remove the negatively developed pattern. The pattern was transferred to the spin-on carbon film by dry-etching under the condition (2) shown below by using the silicon-containing film pattern as an etching mask. The cross section form of the pattern thus obtained was observed by an electron microscope S-9380 (manufactured by Hitachi, Ltd.) and the pattern roughness was observed by an electron microscope (CG4000, manufactured by Hitachi High-Technologies Corp.); and the comparison results of the forms are summarized in Table 5.

(1) Etching Condition in the $CHF_3/CF_4$ Gas System

Instrument: dry etching instrument Telius SP (manufactured by Tokyo Electron Ltd.)

Etching Condition (1):

| Chamber pressure | 10 Pa |
|---|---|
| Upper/lower RF power | 500 W/300 W |
| $CHF_3$ gas flow rate | 50 mL/minute |
| $CF_4$ gas flow rate | 150 mL/minute |
| Ar gas flow rate | 100 mL/minute |
| Treatment time | 40 seconds |

(2) Etching Condition in the $O_2/N_2$ Gas System

Instrument: dry etching instrument Telius SP (manufactured by Tokyo Electron Ltd.)

Etching Condition (2):

| Chamber pressure | 2 Pa |
|---|---|
| Upper/lower RF power | 1000 W/300 W |
| $O_2$ gas flow rate | 300 mL/minute |
| $N_2$ gas flow rate | 100 mL/minute |
| Ar gas flow rate | 100 mL/minute |
| Treatment time | 30 seconds |

TABLE 5

| Example | Silicon-containing film composition | Pattern size of spin-on carbon film after dry etching (line/space) | Pattern cross section form of spin-on carbon film after dry etching | Pattern roughness |
|---|---|---|---|---|
| Example 1 | Sol. 1 | 29 nm/31 nm | Vertical form | 2.9 nm |
| Example 2 | Sol. 2 | 29 nm/31 nm | Vertical form | 3.3 nm |
| Example 3 | Sol. 3 | 30 nm/30 nm | Vertical form | 2.9 nm |
| Example 4 | Sol. 4 | 29 nm/31 nm | Vertical form | 3.3 nm |
| Example 5 | Sol. 5 | 30 nm/30 nm | Vertical form | 3.3 nm |
| Example 6 | Sol. 6 | 32 nm/28 nm | Vertical form | 3.3 nm |
| Example 7 | Sol. 7 | 32 nm/28 nm | Vertical form | 2.7 nm |
| Example 8 | Sol. 8 | 31 nm/29 nm | Vertical form | 3.3 nm |
| Example 9 | Sol. 9 | 30 nm/30 nm | Vertical form | 3.1 nm |
| Example 10 | Sol. 10 | 30 nm/30 nm | Vertical form | 2.9 nm |
| Example 11 | Sol. 11 | 31 nm/29 nm | Vertical form | 3.3 nm |
| Example 12 | Sol. 12 | 32 nm/28 nm | Vertical form | 3.2 nm |
| Example 13 | Sol. 13 | 30 nm/30 nm | Vertical form | 2.7 nm |
| Example 14 | Sol. 14 | 30 nm/30 nm | Vertical form | 3.3 nm |
| Example 15 | Sol. 15 | 29 nm/31 nm | Vertical form | 2.7 nm |
| Example 16 | Sol. 16 | 30 nm/30 nm | Vertical form | 2.7 nm |
| Example 17 | Sol. 17 | 30 nm/30 nm | Vertical form | 3.1 nm |

According to the present invention, as shown in Table 5, the silicon-containing film pattern having the pitch thereof halved as compared with the photoresist film at the time of photo-exposure could be obtained. Further, the spin-on carbon film pattern could be obtained by using this as the etching mask, wherein the cross section form and the pattern roughness of the obtained spin-on carbon pattern were excellent. From these results, it was confirmed that, according to the present invention, a further finer pattern could be formed.

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:

1. A patterning process comprising the steps of:
   (1) forming a photoresist film on a substrate to be processed by using a positive chemically amplifying type photoresist film composition which contains an acid generator, followed by subjecting the photoresist film to photo-exposure and then to negative development by using an organic solvent while generating an acid from the acid generator in the photoresist film, thereby forming a negatively developed pattern that contains an acid generated from the acid generator,
   (2) forming a silicon-containing film on the substrate to be processed having thereon the negatively developed pattern by applying a silicon-containing film composition comprising (i) a silicon-containing compound capable of becoming insoluble in a solvent by an acid contained in the negatively developed pattern or both of the acid and heat and (ii) a solvent not dissolving the negatively developed pattern,
   (3) insolubilizing in a solvent the silicon-containing film in a vicinity of a surface of the negatively developed pattern by an acid contained in the negatively developed pattern as a catalyst or by both of the acid and heating,
   (4) removing the non-insolubilized part of the silicon-containing film by dissolving it with an organic solvent thereby obtaining an insolubilized part as a silicon-containing film pattern,
   (5) dry-etching or wet-etching the upper part of the silicon-containing film pattern thereby exposing the upper part of the negatively developed pattern,
   (6) removing the negatively developed pattern by dry etching or wet etching, and
   (7) transferring the pattern to the substrate to be processed by using, as an etching mask, the silicon-containing film pattern whose upper part is dry-etched or wet-etched.

2. The patterning process according to claim 1, wherein a silicon-containing compound having a substituent group capable of generating a phenolic hydroxyl group, a naphthol hydroxyl group, or both by a heat, an acid, or both is used as the silicon-containing compound.

3. The patterning process according to claim 1, wherein a silicon-containing compound having an epoxy skeleton, an oxetane skeleton, or both is used as the silicon-containing compound.

4. The patterning process according to claim 1, wherein a composition containing a crosslinking agent is used as the silicon-containing film composition.

5. The patterning process according to claim 1, wherein a composition containing a heat-sensitive acid generator is used as the silicon-containing film composition.

6. A patterning process comprising the steps of:
   (1) forming an organic underlayer film on a substrate to be processed, forming a photoresist film on the organic underlayer film by using a positive chemically amplifying type photoresist film composition which contains an acid generator, and then subjecting the photoresist film to photo-exposure and then to negative development by using an organic solvent while generating an acid from the acid generator in the photoresist film, thereby forming a negatively developed pattern that contains an acid generated from the acid generator,
   (2) forming a silicon-containing film on the substrate to be processed having thereon the negatively developed pattern by applying a silicon-containing film composition comprising (i) a silicon-containing compound capable of becoming insoluble in a solvent by an acid contained in the negatively developed pattern or both of the acid and heat and (ii) a solvent not dissolving the negatively developed pattern,
   (3) insolubilizing in a solvent the silicon-containing film in a vicinity of a surface of the negatively developed pattern by an acid contained in the negatively developed pattern as a catalyst or by both of the acid and heating,
   (4) removing the non-insolubilized part of the silicon-containing film by dissolving it with an organic solvent thereby obtaining an insolubilized part as a silicon-containing film pattern,
   (5) dry-etching or wet-etching the upper part of the silicon-containing film pattern thereby exposing the upper part of the negatively developed pattern,
   (6) removing the negatively developed pattern by dry etching or wet etching,
   (7) transferring the pattern to the organic underlayer film by using, as an etching mask, the silicon-containing film pattern whose upper part is dry-etched or wet-etched, and
   (8) transferring the organic underlayer film pattern to the substrate to be processed.

7. The patterning process according to claim 6, wherein a silicon-containing compound having a substituent group capable of generating a phenolic hydroxyl group, a naphthol hydroxyl group, or both by a heat, an acid, or both is used as the silicon-containing compound.

8. The patterning process according to claim 6, wherein a silicon-containing compound having an epoxy skeleton, an oxetane skeleton, or both is used as the silicon-containing compound.

9. The patterning process according to claim 6, wherein a composition containing a crosslinking agent is used as the silicon-containing film composition.

10. The patterning process according to claim 6, wherein a composition containing a heat-sensitive acid generator is used as the silicon-containing film composition.

11. The patterning process according to claim 6, wherein the organic underlayer film is formed by a spin coating method.

* * * * *